United States Patent
Yoon et al.

(10) Patent No.: US 8,373,214 B2
(45) Date of Patent: Feb. 12, 2013

(54) SEMICONDUCTOR DEVICES WITH BURIED BIT LINES AND METHODS OF MANUFACTURING SEMICONDUCTOR DEVICES

(75) Inventors: Jae-Man Yoon, Hwaseong-si (KR); Hui-Jung Kim, Seongnam-si (KR); Hyun-Woo Chung, Seoul (KR); Hyun-Gi Kim, Hwaseong-si (KR); Kang-Uk Kim, Seoul (KR); Yong-Chul Oh, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 262 days.

(21) Appl. No.: 12/760,140

(22) Filed: Apr. 14, 2010

(65) Prior Publication Data
US 2011/0220977 A1    Sep. 15, 2011

(51) Int. Cl.
*H01L 27/108*    (2006.01)
(52) U.S. Cl. .................. 257/296; 257/329; 257/E27.084
(58) Field of Classification Search .................. 257/296, 257/328, 329, 384, E27.084
See application file for complete search history.

(56) References Cited

U.S. PATENT DOCUMENTS

| | | | |
|---|---|---|---|
| 2003/0093751 A1* | 5/2003 | Hohl | 714/781 |
| 2006/0097304 A1* | 5/2006 | Yoon et al. | 257/307 |
| 2008/0002466 A1 | 1/2008 | Kleint et al. | |
| 2009/0250736 A1* | 10/2009 | Yoon et al. | 257/296 |
| 2011/0101447 A1* | 5/2011 | Cho | 257/329 |

FOREIGN PATENT DOCUMENTS

| | | |
|---|---|---|
| JP | 2000-223675 | 8/2000 |
| KR | 1020060041415 | 5/2006 |
| KR | 1020060126795 | 12/2006 |
| KR | 100759839 | 9/2007 |

* cited by examiner

*Primary Examiner* — Wensing Kuo
(74) *Attorney, Agent, or Firm* — F. Chau & Associates, LLC

(57) ABSTRACT

A semiconductor device, comprising: a vertical pillar transistor (VPT) formed on a silicon-on-insulator (SOI) substrate, the VPT including a body that has a lower portion and an upper portion, a source/drain node disposed at an upper end portion of the upper portion of the body and a drain/source node disposed at the lower portion of the body; a buried bit line (BBL) formed continuously on sidewalls and an upper surface of the lower portion, the BBL includes metal sificide; and a word line that partially enclosing the upper portion of the body of the VPT, wherein the BBL extends along a first direction and the word line extends in a second direction substantially perpendicular to the first direction. An offset region is disposed immediately beneath the word line.

23 Claims, 23 Drawing Sheets

SEMICONDUCTOR DEVICES WITH BURIED BIT LINES AND METHODS OF MANUFACTURING SEMICONDUCTOR DEVICES

This U.S. non-provisional patent application claims priority under 35 U.S.C §119 to Korean Patent Application No. 10-2010-0021211, filed on Mar. 10, 2010, in the Korean Intellectual Property Office, which is related to U.S. patent application Ser. No. 11/954,135 filed with the USPTO on Dec. 11, 2007, the contents of which are incorporated by reference herein.

TECHNICAL FIELD

The present disclosure relates to semiconductor devices and methods of fabricating semiconductor devices, more particularly, to semiconductor devices whose memory cells have vertical pillar structures.

DISCUSSION OF THE RELATED ART

Most of the current semiconductor memory devices employ metal oxide semiconductor (MOS) transistors in memory cells thereof. Increased density and performance are continual demands of the marketplace and such demands impose challenges to the physical limits of MOS transistor manufacturing technology. The size of minimum feature used to make the memory cells, e.g., for a DRAM device, approaches to about 0.1 µm. The small channel length of the cell transistor degrades DRAM characteristics seriously in many ways. One of the issues is reduction of data retention time. Generally, a DRAM cell comprises one switch transistor and one capacitor. The level of charges stored in the capacitor determines whether the data is "1" or "0". The switch transistor turns on for writing and reading the data. For the DRAM device, data or charges stored in the cell capacitors must be refreshed because the charges leak from the capacitors. The charges in the capacitor leak through several paths. One is through the switch transistor. Even if the switch transistor maintains a turn off state, sub-threshold current continues to flow through the switch transistor. As the channel length of the switch becomes shorter, the sub-threshold current becomes larger. To reduce the sub-threshold current, the threshold voltage of the switch transistor is adjusted much higher than that of transistors used in the peripheral area. However, a good portion of sub-threshold current flows beneath the channel which is not affected by the threshold voltage of the transistor. Furthermore, the increase of the threshold voltage of the switch transistor is limited to some extent because high threshold voltage causes the reduction of turn-on current. When a read operation is performed, the time required for charge transfer from the cell capacitor to bit-line is increased as the turn-on current reduces, which means the increase of data access time. A second charge leakage path is through the dielectric material of the capacitor. To increase the charge stored in the capacitor, the capacitor structure is designed to have maximum area and minimum thickness of dielectric material ($C = \epsilon A/t$, where A is the area of the capacitor and t is the thickness of the dielectric material). As the dielectric material becomes thinner, the chance of leakage through the dielectric material increases. Finally, the cell charge leaks through a junction formed between one node of the switch transistor and the silicon substrate. All of these leakage paths contribute to the reduction of data retention time of the cell capacitor, which requires inevitably more frequent refresh operations to restore the charges stored in the capacitor and degrade performance of the system in which the DRAM device are used.

Another issue due to scaling down of DRAM devices comes from process complexities. The down scaling of memory cell patterns requires more high-resolution photolithography machines for patterning the minimum feature. Typically high-resolution photolithography machines have less valid focal depth than low-resolution photolithography machines. Therefore the cell area is required to be planarized before the photolithography process. Such a planarization process is performed through a chemical mechanical polishing (CMP) process. That is, after the deposition of a thick insulating material, blanketly etches back the insulating material layer by the CMP process until the surface becomes planarized. Though the planarization process is helpful followed by photolithography, the distance between a silicon surface where the switch transistor is located and the conductive layer becomes longer. Thus, the aspect ratio of a contact plug used to connect the switch transistor with the conductive layer becomes high. Such a high aspect ratio causes parasitic capacitance. For example, under typical DRAM process, the width of bit line is scaled down in proportion to the overall scale down of the DRAM process. However, the capacitance of a bit-line is rarely reduced due to the parasitic capacitance, which means that the capacitance of cell capacitors cannot be scaled down to maintain proper ratio of bit-line capacitance to cell capacitor capacitance. This requires a more complicated cell capacitor structure because nearly the same capacitor area should be maintained despite a reduced cell area.

Some of the processes introduced to counteract the above issues include use of silicon-on-insulator (SOI) substrate instead of silicon substrate. As discussed above, one of the leakage paths is junction leakage. The cell capacitor is connected to one of the switch transistor nodes and the node comprises a junction with silicon substrate. Because the junction is reverse biased, junction leakage $-I_0$ is unavoidable (Junction current is expressed as $I = I_0 (\text{EXP}(qV_D/kT) - 1)$ where $V_D$ is junction bias, q is electron charge, k is Voltzman constant and T is temperature. When the junction is reverse biased, $V_D$ is negative and exponential component approaches to 0, so the junction current becomes $-I_0$). By introducing SOI substrate, the switch transistor node connected to a cell capacitor is disposed on an insulator and does not form a conductive junction, which means that a junction current does not exists. SOI structure also reduces sub-threshold current through the switch transistor. This is because the channel of the switch transistor is disposed on the insulating material, the sub-threshold current beneath the channel, that is, through the silicon substrate, can be eliminated.

Another approach is to introduce vertical pillar transistors (VPTs). Instead of forming the source/drain nodes of the switch transistor on a silicon surface, a VPT forms the source/drain node of the switch transistor on each end of a silicon pillar. Bit lines surround the bottom portion of the VPT transistors, making contact with only one of the source or drain nodes of the switch transistor. Unlike the conventional DRAM devices which requires high aspect ratio contact plug to connect between the bit line and the node of the switch transistor, a VPT forms contact between the node of the switch transistor and a bit line buried therewith. Without connection to contact plugs, the parasitic capacitance of buried bit lines is dramatically reduced, which means that less capacitance is required for the cell capacitor while maintaining the same ratio of bit line capacitance to cell capacitance.

Further, by use of an SOI substrate, the bit lines can be disposed on insulating material, which reduces bit line to substrate parasitic capacitance. The gate of a VPT encompasses generally the middle of the pillar and gate oxide is disposed between the pillar and the gate material. Because a (vertical) channel is formed around the pillar, channel width can be effectively increased in small cell areas and turn-on current can be larger than that of conventional DRAM cells. Because of the large turn-on current, threshold voltage of the switch transistor can be adjusted relatively high and can reduce the sub-threshold current. Moreover, nearly all cross section of the pillar inside the gate acts as a channel, and the sub-threshold current through the substrate is thus minimized. The top portion of the pillar is connected to a cell capacitor. Unlike a conventional planar DRAM cell, the top node of the switch transistor does not form any junction with the substrate, and junction leakage is minimal.

While the use of VPTs may afford benefits discussed above, an issue of VPT structures arises from the bit line that encompasses the bottom portion of the pillar. Bit line width is one of the controlled factors that determine the DRAM cell size and overall chip size of the DRAM device. Because the width of bit lines is controlled to have a minimum feature size, the resistance of bit lines can be a factor to cause the speed degradation of the DRAM devices. For example, in performing a read operation, the switch transistor is turned on and the charge stored in the cell capacitor is transferred to a sense amplifier through a bit line. It is therefore the bit line capacitance and the bit line resistance that determines the charge transfer time. As the resistance increases, the starting time of a sense amplifier is delayed, resulting in increase of data access time. The bit line resistance is more of an issue in conventional VPTs because the bit line surrounds the bottom of the pillar, the charge transfer (bit line current) through the bit line can be blocked by the pillar, and charges can be trapped in the pillar. Therefore, overall effective bit line resistance increases. Polysilicon is typically the material used for bit lines. The conductivity of polysilicon is much lower than that of metallic materials.

SUMMARY

A semiconductor device comprises a vertical pillar transistor (VPT) formed on a substrate, the VPT including a body that has a lower portion and an upper portion, a buried bit line (BBL) formed continuously on at least a surface of the lower portion, the upper portion being partially enclosed by a word line, wherein the BBL extends along a first direction and the word line extends in a second direction substantially perpendicular to the first direction, and wherein the BBL is metal silicide. The semiconductor device further includes an offset region disposed immediately beneath the word line. The offset region may be a protrusion that protrudes substantially coaxially from the body. The offset region may be lightly doped with impurities. The BBL may be further formed on a sidewall of the lower portion. The semiconductor may additionally include an insulating pattern interposed between the word line and the BBL. The semiconductor may further include a capacitor connecting to the upper end portion of the body of the VPT, wherein the capacitor comprises two conductive plates that extend vertically from the VPT. The semiconductor may further include at least one planar transistor having both a source node and a drain node disposed on the substrate. The semiconductor may additionally include at least one planar transistor having both a source node and a drain node disposed on another substrate disposed a level above or a level below the VPT and the substrate. The semiconductor may additionally include at least one planar transistor having both a source node and a drain node disposed on another substrate disposed a level above or a level below the VPT and the substrate.

A semiconductor device comprises a vertical pillar transistor (VPT) formed on a substrate, the VPT including a body that has a substantially rectangular lower portion supporting a cylindrical upper portion, a protrusion that protrudes substantially coaxially from the bottom portion of the upper portion, a buried bit line (BBL) formed continuously on a surface of the lower portion and a portion of the protrusion, the upper portion being partially enclosed by a word line, wherein the BBL extends along a first direction and the word line extends in a second direction substantially perpendicular to the first direction, and wherein the BBL is metal silicide.

In a method of forming a memory device, a mask is formed on a substrate. A plurality of vertical pillar transistors (VPTs) are formed on the substrate by partially etching the substrate using the mask. Each VPT has a body that has a lower portion and an upper portion. A source/drain node is formed at an upper end portion of the upper portion of the body and drain/source nodes are formed at the lower portion of the body of each VPT. A buried bit line (BBL) is formed on the lower portion of the body. The BBL extends continuously in a first direction covering at least surfaces of the lower portions of the plurality of VPTs. The forming of the BBL includes depositing a metal layer and silicidating the metal layer. A word line is formed to extend in a second direction and partially encloses the upper portions between the source/drain nodes and the drain/source nodes of the plurality of VPTs. The second direction may be substantially perpendicular to the first direction.

A method of forming a semiconductor device, comprises: forming a plurality of vertical pillar transistors (VPTs) on a substrate, each VPT including a body that has a substantially rectangular lower portion and a substantially cylindrical upper portion, a source/drain node disposed at an upper end portion of the body and drain/source nodes disposed at the lower portion of the body; forming a protrusion that protrudes substantially coaxially from the bottom portion of the upper portion of the body; forming a buried bit line (BBL) that extends in a first direction that covers the surfaces of the lower portions of the bodies of the VPTs and lower portions of the protrusions, wherein forming the BBL includes depositing a metal layer and silicidating the metal layer; and forming a word line that extends in a second direction and partially encloses the upper portions between the upper end portions of the bodies of the VPTs and the protrusions. The second direction is substantially perpendicular to the first direction.

A semiconductor memory card comprises: an interface part that interfaces with an external device, a controller that communicates with the interface part and a memory device via address and data buses. The memory device comprises: a vertical pillar transistor (VPT) formed on a substrate, the VPT including a body that has a lower portion and an upper portion, a source/drain node disposed at an upper end portion of the upper portion of the body, and a drain/source node disposed at the lower portion of the body; a buried bit line (BBL) formed continuously on a sidewall and a surface of the lower portion, the BBL including metal silicide; and a word line that partially encloses the upper portion of the body of the VPT. The BBL extends along a first direction and the word line extends in a second direction substantially perpendicular to the first direction.

A computer system comprises the above-described memory device. The computer system is one of the group consisting of a personal computer (PC), a personal digital assistant (PDA), an MP3 player, a digital audio recorder, a pen-shaped computer, a digital camera, or a video recorder.

DESCRIPTION OF EMBODIMENTS

Figure 1:
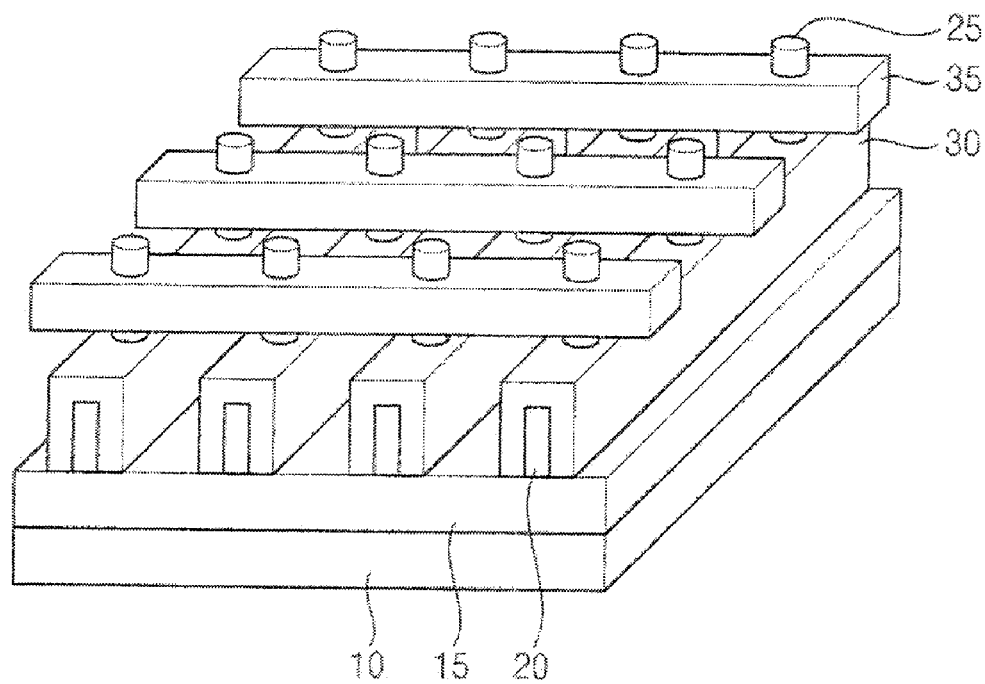
FIG. 1 illustrates a portion of a memory device having vertical pillar transistors (VPTs) according to exemplary embodiments.

The exemplary embodiments will now be described more fully hereinafter with reference to the accompanying drawings, in which embodiments are shown. These examples, however, may be embodied in many different forms and should not be construed as limited to the embodiments set forth herein. Rather, these embodiments are provided so that this disclosure will be thorough and complete, and will fully convey the scope. In the drawings, the thicknesses of layers and regions are exaggerated for clarity. Like reference numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "vertical" refers to a direction that is substantially orthogonal to a horizontal direction.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIG. 1 illustrates a portion of a memory device having vertical pillar transistors (VPTs) according to exemplary embodiments.

Referring to FIG. 1, the VPTs are provided on a silicon-on-insulator (SOI) substrate, which may comprise a silicon substrate 10, an oxide layer 15 and a silicon layer. Alternatively, a germanium-on-insulator (GOI) substrate may be used, as well as a silicon substrate, a germanium substrate, a silicon-germanium substrate, etc.

Each of the VPTs includes a body that has a lower portion 20 and an upper portion 25. The lower and the upper portions 20 and 25 of the VPT may be formed by etching the silicon layer of the substrate. The lower portion 20 of the VPT may be elongated and rectangular in shape.

According to exemplary embodiments, a buried bit line (BBL) 30 may be formed by depositing a conductive layer on sidewalls and a portion of the top surface of the lower portion 20. The conductive layer may be formed by a silicidation process, using transition metal silicide, including near-noble and refractory metal silicide such as titanium silicide, tungsten silicide, cobalt silicide, nickel silicide, etc. The metal silicide may produce characteristics such as high corrosion resistance, oxidation resistance, good adhesion to and minimal reaction with silicon oxide low interface stress, etc. The metal silicide may be obtained by a silicidation process after a sputtering process, a chemical vapor deposition (CVD) process, an atomic layer deposition (ALD) process, or other like processes.

The BBL 30 may extend along a first (elongated) direction to support a plurality of VPTs. Each upper portion 25 of the VPT may be dimensioned and shaped like a pillar, and may be cylindrical in shape with an end portion formed over the lower portion 20. A word line 35 may extend in a second direction substantially perpendicular to the first direction to partially enclose a plurality of upper portions 25 of a respective plurality of VPTs. Each of the word lines 35 may be spaced apart from the BBL 30 by a BBL offset. That is, each BBL 30 may be separated from each word line 35 by a distance corresponding to the BBL offset.

According to exemplary embodiments, each BBL 30 may include an impurity region and a metal silicide layer. The impurity region of the BBL 30 may locate at a surface of the lower portion 20 and the metal silicide layer may cover the impurity region. The metal silicide layer may cover the top surface of the lower portion 20 of the VPT only. Alternatively, the metal silicide layer may cover the top surface and the sidewalls of the lower portion 20 of the VPT as described above.

A method of fabricating a memory device including a memory cell region having a plurality of VPTs is illustrated and described below with reference to FIGS. 2 to 17. FIGS. 2 and 4 to 17 are cross sectional views illustrating the method of fabricating the memory device in accordance with exemplary embodiments, and FIG. 3 is a plan view illustrating a mask structure in accordance with exemplary embodiments.

Figure 2:
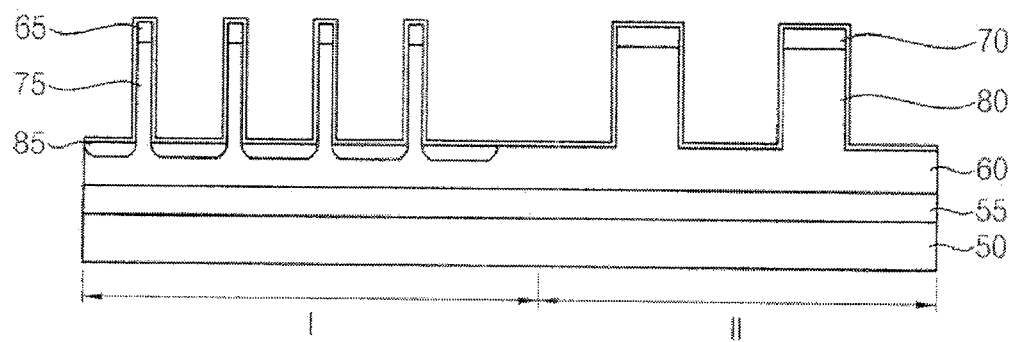
FIGS. 2 to 22 illustrate a method of fabricating a memory device including a memory cell region having a plurality of VPTs according to exemplary embodiments.

Referring to FIG. 2, a silicon-on-insulator (SOI) substrate is formed with a bottom silicon layer 50, an insulation oxide layer 55 formed on the bottom silicon layer 50, and a silicon layer 60 formed on the insulation oxide layer 55. The silicon layer 60 may have a thickness of about 3,000 Å to about 5,000 Å and the insulation oxide layer 55 may have a thickness in a range of about 1,500 Å to about 2,500 Å. Alternatively, a germanium-on-insulator GOI substrate or other substrate having a semiconductor layer thereon may be used as a substrate on which the memory device is provided. The substrate has a first area I and a second area II.

A mask structure is provided on the silicon layer 60 of the substrate. As illustrated in FIG. 3, the mask structure includes a first mask 65 and a second mask 70. According to exemplary embodiments, a plurality of first masks 65 and a plurality of second masks 70 may be formed in the first area I and the second area II, respectively. The mask structure having the first and the second masks 65 and 70 may be used in formation of a plurality of pillar-shaped structures in the first area I and a plurality of rectangular-shaped structures in the second area II. The pillar-shaped structures in the first area I are used to form first transistors having vertical channels, e.g., transistors having source/drain regions and channel regions formed therebetween that may be substantially vertical to the major horizontal axis of the substrate. The vertical channel transistors (VPT) may afford superior density and performance characteristics discussed above and accordingly they may be used to form memory cells of a memory device. The rectangular-shaped structures formed in the second area II may be used to form second transistors having planar source/drain regions and channel regions, e.g., the source/drain regions and the channel regions formed therebetween may be substantially coplanar with the major horizontal axis of the substrate. The rectangular-shaped structures may have a larger footprint on the substrate as compared to the pillar structures, and thus there are fewer rectangular-shaped structures occupying the same amount of real estate on the substrate as compared to the pillar-shaped structures. The larger footprint of the planar transistors may facilitate better current drive characteristics suitable for peripheral circuit devices.

Figure 3:
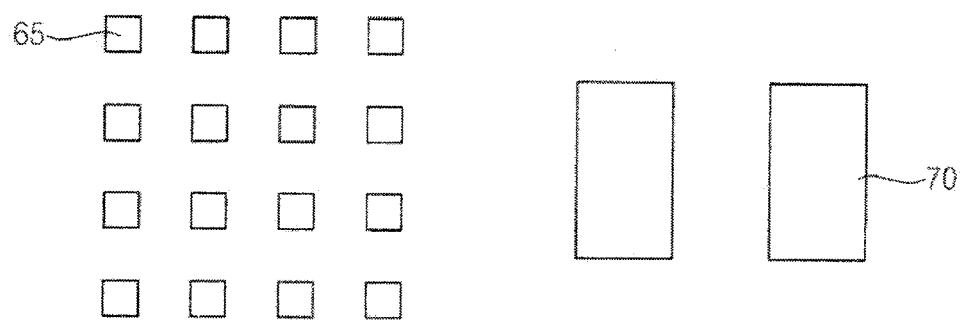

Referring to now FIGS. 2 and 3, the mask structure having the first masks 65 and the second masks 70 is provided in the first area I and the second area II on the substrate. Each of the first and the second masks 65 and 70 may have a thickness of about 1,500 Å to about 2,500 Å. According to an exemplary embodiment, a pad oxide layer may additionally be formed the silicon layer 60 before forming the first and the second masks 65 and 70 on the silicon oxide layer 60 of the substrate. The pad oxide layer may reduce the stress generated in the formations of the first and the second masks 65 and 70. The first and the second mask 65 and 70 may be formed using nitride such as silicon nitride. The pad oxide layer may include silicon oxide.

Using the first and the second masks 65 and 70 as etching masks, the silicon layer 60 of the substrate is partially etched to form first upper portions 75 of the first transistors in the first area I and second upper portions 80 of the second transistors in the second area II. The first upper portions 75 may be shaped in various geometric forms including rectangular, circular, elliptical, etc. For exemplary embodiments, the first upper portions 75 may be shaped like pillars that may extend vertically with a circular cross section, while the second transistors to be formed in the second area II having second upper portions 80 may be shaped to have a wider aspect ratio and footprint on the substrate. Each of the first and the second upper portions 75 and 80 may have a height of about 2,000 Å to about 3,000 Å. Upon forming the first and the second upper portions 75 and 80, first and second exposed portions of the silicon layer 60 are formed proximal to respective first and second upper portions 75 and 80.

First impurities are doped into the first exposed portions of the silicon layer 60 in the first area I. According to at least one exemplary embodiment, the first impurities may include phosphor (P), arsenic (As), stibium (Sb), etc. The first impurities may be doped with energy of about 10 Kev. The first impurities may be implanted into the first exposed portions of the silicon layer 60 to facilitate preliminary first impurity regions 85 in the first area I between adjacent first upper portions 75. Each of the preliminary first impurity regions 85 may have a relatively low ion concentration. For example, the preliminary first impurity regions may have ion concentrations of about $1 \times 10^{13}$ cm$^2$.

An oxide layer 83 is formed on the first and the second upper portions 75 and 80. The oxide layer 83 covers the first preliminary impurity regions 85 and the second exposed portions of the silicon layer 60. The oxide layer 83 may cure etched damages to the first and the second upper portions 75 and 80. The oxide layer 83 may include silicon oxide obtained by a thermal oxidation process, radical oxidation process, etc. In one exemplary embodiment, the oxide layer 83 may have a relatively thin thickness of about 20 Å to about 80 Å.

Figure 4:
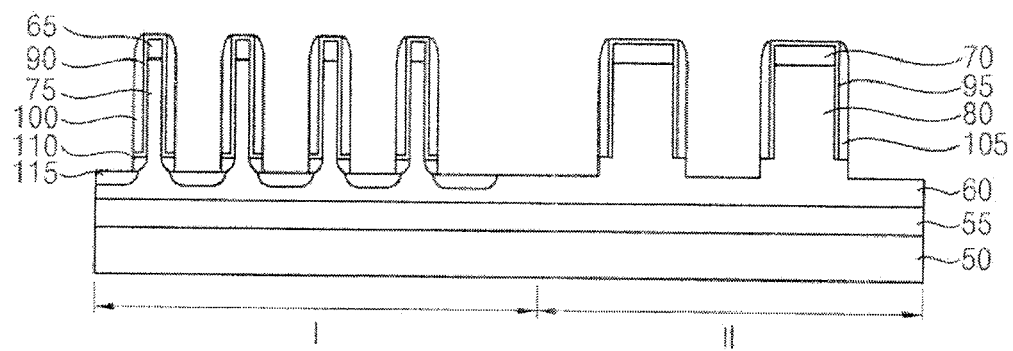

Referring to FIG. 4, a first spacer formation layer (not illustrated) is conformally formed on the oxide layer 83 in the first and the second areas I and II. The first spacer formation layer may include nitride or oxynitride. The first spacer formation layer may have a thickness of about 200 Å to about 300 Å. Thus, the thickness ratio between the oxide layer 83 and the first spacer formation layer may be in a range of about 1.0:2.5 to about 1.0:15.0.

The first spacer formation layer and the oxide layer 83 are partially etched to form first spacers 100, second spacers 105, first oxide layer patterns 90 and second oxide layer patterns 95. The first and the second oxide layer patterns 90 and 95 cover the outer surfaces of the first upper portions 75 and the second upper portions 80 in the first and the second areas I and II, respectively. The first spacers 100 are formed on sidewalls of the first upper portions 90 in the first area I. Each of he first oxide layer patterns 90 is located between each first spacer 100 and the outer surface of each first upper portion 75. The second spacers 105 are formed on sidewalls of the second upper portions 80 in the second area II. Here, each second oxide layer pattern 95 is positioned between each second spacer 105 and the outer surface of each second upper portion 80. In exemplary embodiments, each of the first spacers 100 may be used as a replacement gate in the first area I.

In both of the first and the second areas I and II, except a lower portion proximal to the silicon layer 60, the first spacers 100 and the second spacers 105 may encompass substantially the entire sidewalls of the first and the second upper portions 75 and 80. Further, the first spacers 100 may cover portions of the preliminary first impurity regions 85 in the first area I.

In the first area I, using the first spacers 100 as etching masks, the portions of the silicon layer 60 between the lower portions of the first spacers 100 and the preliminary first impurity portions 85 are partially etched to form first impurity regions 110 of the first transistors. Portions of the silicon layer 60 beneath the first spacers 90 may serve as buried bit line (BBL) offsets. In other words, the BBL off sets may have heights substantially the same as or substantially similar to those of the first impurity regions 110 formed beneath the first spacers 100.

Second impurities are doped into portions of the silicon layer 60 exposed between adjacent first spacers 90 to form preliminary second impurity regions 115 in the first area I. The second impurities may include arsenic, phosphor, stibium, etc. Each of the preliminary second impurity regions 115 may have a relatively high ion concentration. For example, the preliminary second impurity regions 115 may have impurity concentration of about $1 \times 10^{15}$ cm$^2$. That is, the preliminary second impurity regions 115 may have ion concentrations substantially larger than those of the first impurity regions 110. In other words, the portions of the silicon layer 60 between adjacent first upper portions 75, immediately adjacent and beneath the first impurity regions 110, may be referred to as the preliminary second impurity regions 115. Each of the first impurity regions 110 is provided between respective first spacers 100 and the preliminary second impurity regions 115. The lightly doped portions of the first impurity regions 110 may be referred to as the BBL offsets. According to exemplary embodiments, the BBL offsets 110 may be substantially the same or substantially similar in thickness (or height) as the first impurity regions 110. For example, each BBL offset may have a height in a range of about 500 Å to about 1,000 Å. The BBL offsets (i.e., the first impurity regions 110) may be formed to protrude substantially coaxially from the bottom portion of the first upper portions 75.

According to a further aspect of exemplary embodiments, the preliminary second impurity regions 115 may be doped, at a level considered to be heavily doped as compared to the lightly doped BBL offsets 110, to facilitate use of the preliminary second impurity regions 115 as drain regions or source regions of the first transistors.

Figure 5:
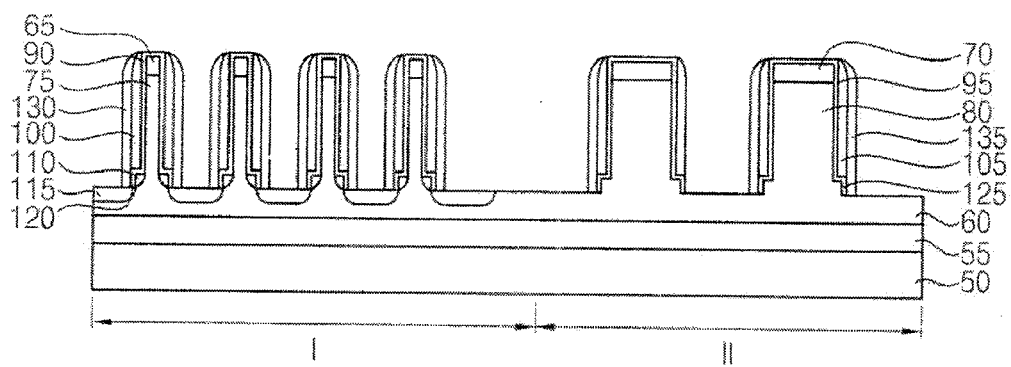

Referring to FIG. 5, first sidewall oxide films 120 are formed on sidewalls of the BBL offsets 110 in the first area I, and second sidewall oxide films 125 are formed beneath the second spacers 105 in the second area II. The first and the second sidewall oxide films 120 and 125 may be obtained by a thermal oxidation process, a radical oxidation process, a CVD process, or the like process. Each of the first and the second sidewall oxide films 120 and 125 may have a thickness of about 20 Å to about 60 Å.

A second spacer formation layer (not illustrated) is formed on the silicon layer 60 to cover the resultant structures in the first and the second areas I and II. The second spacer formation layer may include nitride or oxynitride. The second spacer formation layer may have a thickness of about 50 Å to about 100 Å. The second spacer formation layer is partially etched to form third spacers 130 and fourth spacers 135 on the first spacers 110 and the second spacers 105, respectively. Each of the third and the fourth spacers 130 and 135 may have a thickness of about 50 Å to about 100 Å. Therefore, a thickness ratio of the first spacer 90 relative to the third spacer 130 may be in a range of about 1.0:0.2 to about 1.0:0.5. Similarly, a thickness ratio of the second spacer 95 with respect to the third spacer 130 may also be about 1.0:0.2 to about 1.0:0.5.

The third spacers 130 cover the first sidewall oxide films 120, the first spacers 100, and portions of the preliminary second impurity regions 115 in the first area I. The fourth spacers 135 cover the second sidewall oxide films 125 and the second spacers 105 in the second area II. The third spacers 130 and the fourth spacers 135 are formed to block the formation of metal silicide on the above-described covered portions when a silicidation process is performed on the device, as will be further described below.

Figure 6:
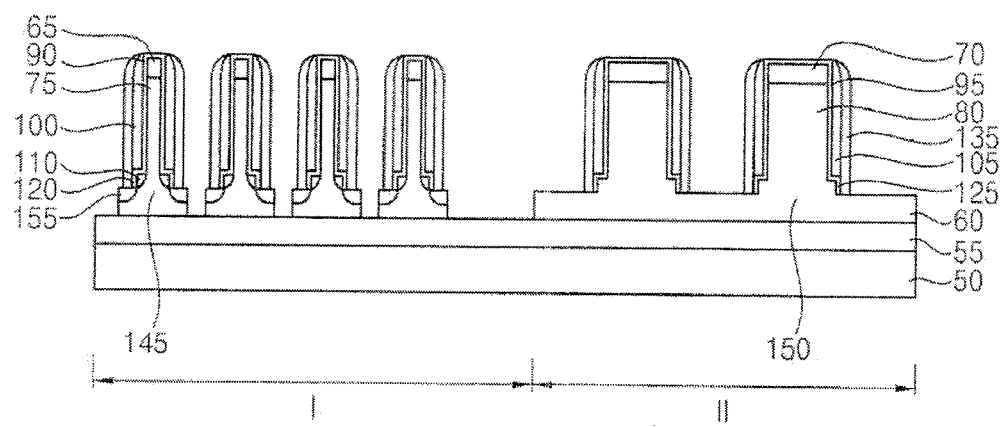

Referring to FIG. 6, the silicon layer 60 is further etched until the oxide layer 55 is exposed. Line type etching or equivalent masks may be used. The etching exposes portions of first lower portions 145 beneath the first upper portions 75 (pillars) of the first transistors in the first area I, and second lower portions 150 beneath the second upper portions 80 in the second area II, respectively.

In the first area I, the first lower portions 145, formed from the unetched portions of the silicon layer 60, may be rectangular in shape. Each (rectangular) block of the first lower portions 145 may extend in a first direction to support a plurality of first upper portions 75 of respective first transistors. Each block of the first lower portions 145 may form one of a plurality of buried bit lines.

The preliminary second impurity regions 115 are partially removed to form second impurity regions 155 in the first area I while forming the first lower portions 145. Each of the second impurity regions 155 remains on each side of the first lower portions 145, beneath the BBL offsets 110, to provide the source regions (or the drain regions) of the first transistors. As illustrated in FIG. 6, the first lower portions 145 are unprotected by the third spacers 130 and a metal silicidation process performed on structures disposed in the first area I will result in formation of metal silicide on the sidewalls and any unprotected upper surface of the first lower portions 145 of the first transistors.

In the second area II, the silicon layer 60 may be partially etched so that the oxide layer 55 of the substrate is not exposed.

Figure 7:
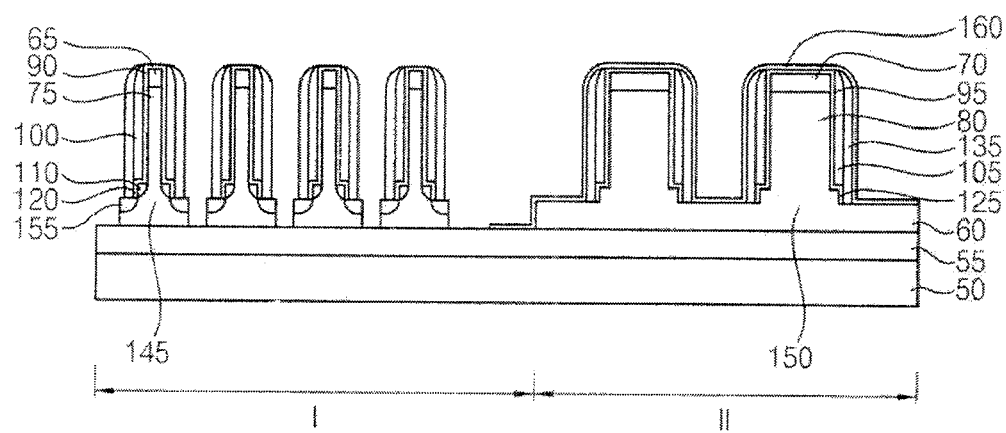

Referring to FIG. 7, a first protection layer (not illustrated) covering the resultant structures and the exposed portions of the substrate is formed to serve as a silicidation blocking layer. The first protection layer may include oxide, for example, silicon oxide. The first protection layer may include silicon oxide and have a thickness of about 50 Å to about 150 Å.

The first protection layer is etched to form a protection layer pattern 160, covering the resultant structures in the second area II. Note that this etching process to produce the first protection layer pattern 160 may not be performed in the first area I.

Figure 8:
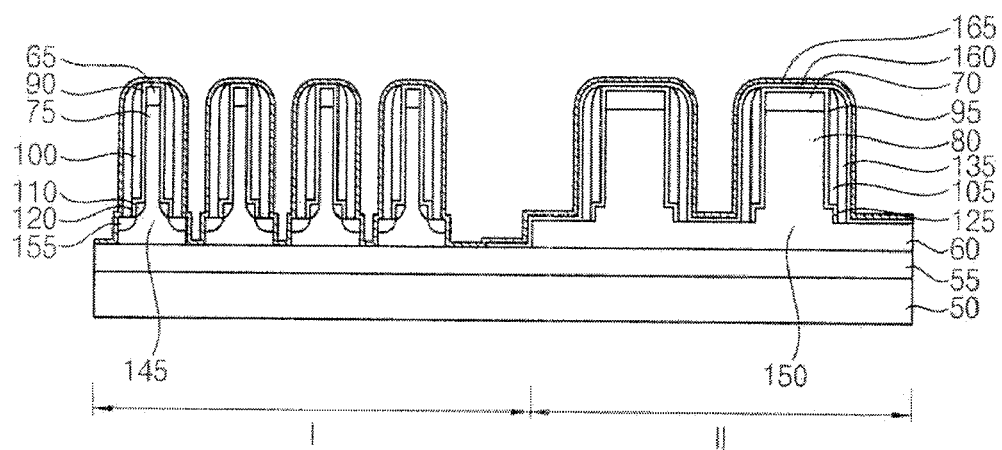

Referring to FIG. 8, a metal layer 165 is formed to cover the structures in the first area I including sidewalls of the second impurity regions 155 and the first lower portions 145, and the protection layer pattern 160 in the second area II. According to exemplary embodiments, the metal layer 165 may cover the surfaces and the sidewalls of the first lower portions 145 including the second impurity regions 155. The metal layer 165 may include transition metal, for example, tungsten, titanium, cobalt, or nickel. The metal layer 165 may be formed by a sputtering process, an ALD process, an evaporation process, a CVD process, or other like processes. The metal layer 165 may have a thickness of about 50 Å to about 100 Å.

Figure 9:
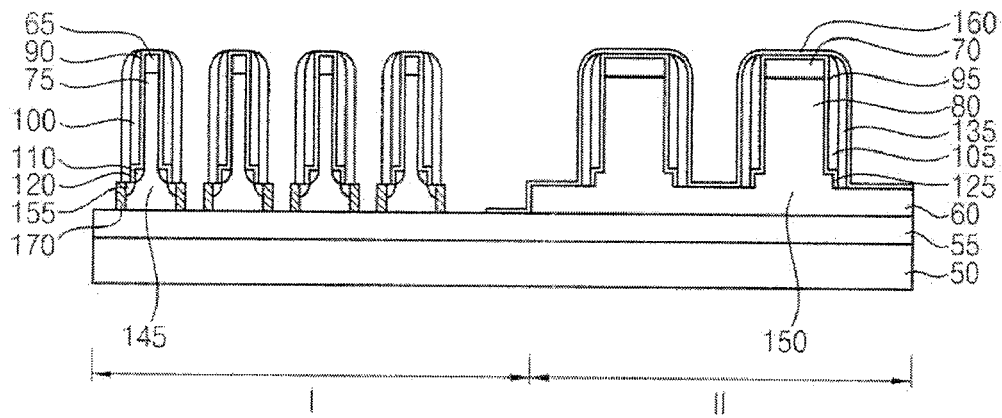

Referring to FIG. 9, the silicidation process is performed on the metal layer 165 to thus form metal silicide layers 170 on the surfaces and the sidewalls of the second impurity regions 155 and the first lower portions 145. According to exemplary embodiments, the silicidation process may produce transition metal silicide, including near-noble and refractory metal silicide such as titanium silicide, tungsten silicide, cobalt silicide, nickel silicide, etc. The metal silicide may produce characteristics such as high corrosion resistance, oxidation resistance, good adhesion to and minimal reaction with silicon oxide (SiOx), low interface stress, etc.

According to exemplary embodiments, metal silicide layers are not formed on structures in the second area II because of the protection layer pattern 160 previously formed thereon.

Figure 10:
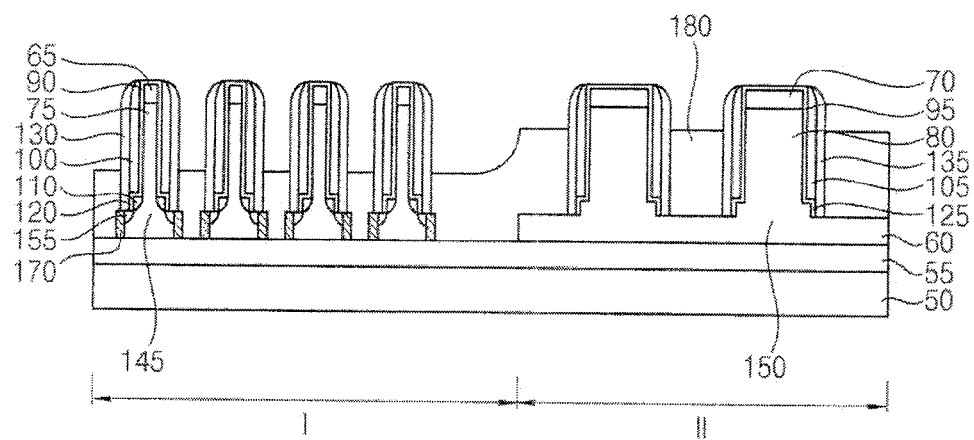

Referring to FIG. 10, a preliminary first insulation layer (not illustrated) is formed on the substrate to cover the resultant structures in the first and the second areas I and II. The preliminary first insulation layer may be formed using oxide, for example, undoped silicate glass (USG), spin on glass (SOG), phosphor silicate glass (PSG), boro-phosphor silicate glass (BPSG), flowable oxide (FOX), Tonen Silazene (TOSZ®), tetraethyl ortho silicate (TEOS), plasma enhanced-TEOS (PE-TEOS), etc.

The preliminary first insulation layer is partially etched to form a first insulation layer 180 on the substrate, and on the first upper portions 75 to expose substantially most of the entire length of third spacers 130 in the first area I, and partially on the second upper portions 80 to expose upper portions of the fourth spacers 135 in the second area II. Since the silicon layer 60 remains in the second area II, a first portion of the first insulation layer 180 in the first area I may be substantially lower than a second portion of the first insulation layer 180 in the second area II. For example, a thickness difference between the first portion of the first insulation layer 180 and the second portion of the first insulation layer 180 may be below about 300 Å.

Figure 11:
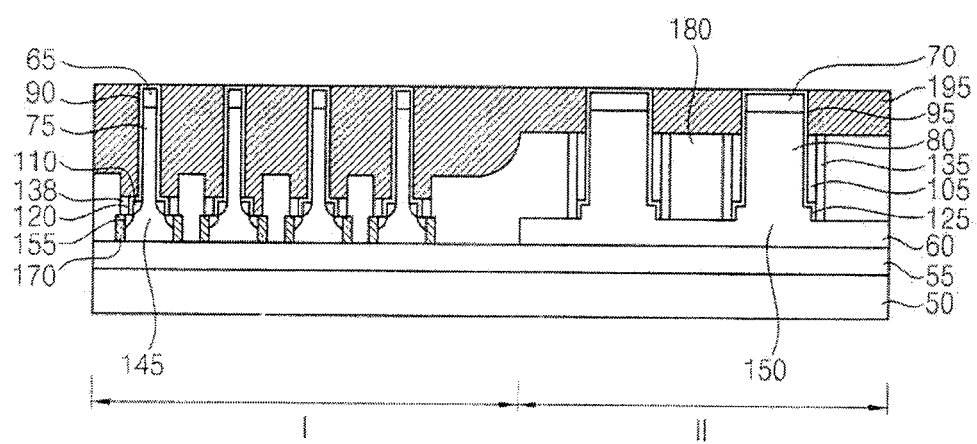

Referring to FIG. 11, the first and the third spacers 100 and 130 are selectively removed from the first upper portions 75 in the first area I, and the exposed portions of second and the fourth spacers 105 and 135 are selectively removed from the second upper portions 80 in the second area II. Lower portions of the third spacers 130 remain between the first sidewalls oxide films 120 and first insulation layer 180 in the first area I, so that protection patterns 138 are provided on the metal silicide layers 170. Thus, the metal silicide layers 170 may be effectively separated from word lines by the protection patterns 138 and the first sidewall oxide layers 120.

A conductive layer 195 is formed on the first insulation layer 180, the protection patterns 138 and the first sidewall oxide layers 120. The conductive layer 195, to be used to form a plurality of contiguous conductive structures as well as gate electrodes connecting to the vertical channels of the first transistors in the first area I, makes contact with the BBL offsets 110, but is spaced apart from the metal silicide layers 170 (BBL) due to the interposing first sidewall oxide layers 120 and the protection patterns 138 caused from the lower portions of the third spacers 130 that remain. The conductive layer 195 may include polysilicon doped with impurities, metal and/or metal compound. The lightly doped BBL offsets 110 may serve as encroachment buffers to prevent leakage current flow from the metal silicide layers 170 (BBL). According to exemplary embodiments, the conductive layer 195 may be planarized by a CMP process and or an etch-back process.

Figure 12:
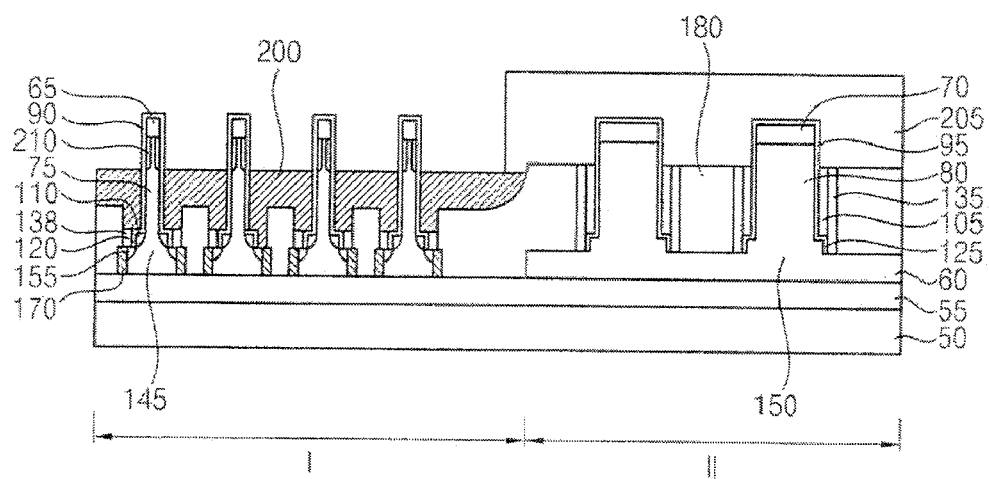

Referring to FIG. 12, in the first area I, the conductive layer 195 is partially etched to form rectangular shaped conductors, wherein each conductor may extend in a second direction and partially encompass the first upper portions 75 in a plurality of first transistors to form one of a plurality of word lines 200 (see e.g., 35 in FIG. 1). The second direction may be substantially perpendicular to the first direction, the orientation of the BBLs. The conductive layer 195 in the second region II is fully etched and completely removed from the first insulation layer 180.

A mask 205 is formed on the first insulation layer 180 and a portion of the word line 200 to cover the resultant structures in the second area II. Third impurities are doped into portions of the first upper portions 75 to thereby form third impurity regions 210. The third impurities may be doped at a level sufficient for the third impurity regions 210 to act as drains (or sources) of respective first transistors. The third impurities may be implanted into the portions of the first upper portions 75 by a predetermined angle. The third impurities may include phosphor, arsenic, stibium, etc. Each of the third impurity regions 210 may have a relatively low ion concentration of about $1 \times 10^{13}$ cm$^2$.

According to exemplary embodiments, the first transistors (VPTs) include the third impurity regions 210 and corresponding the first impurity regions 110, so that channels of the first transistors may be vertically oriented along the sidewalls of the first upper portions 75 interposed between the third impurity regions 210 and the first impurity regions 110 connected to one of the word lines 200. The BBL offsets 110 may be contacted with and may be disposed immediately beneath the word lines 200, with the second impurity regions 155 formed within the first lower portions 145. The first lower portions 145 are covered with the metal silicide layers 170.

Figure 13:
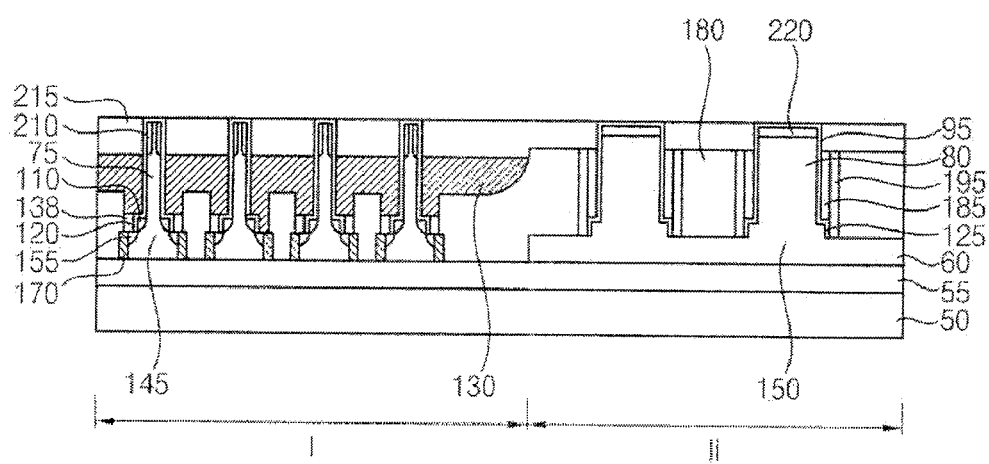

Referring to FIG. 13, a preliminary second insulation layer (not illustrated) is formed on the word lines 200 and the first insulation layer 180, after removing the first and the second masks 65 and 70. The preliminary second insulation layer is etched to reach the top of the first and the second upper portions 75 and 80, so that a second insulation layer 215 is provided on the word line 200 and the first insulation layer 180 in the first and the second areas I and II.

In the second area II, fourth impurities are doped into the second upper portions 80 to form fourth impurity regions 220.

Figure 14:
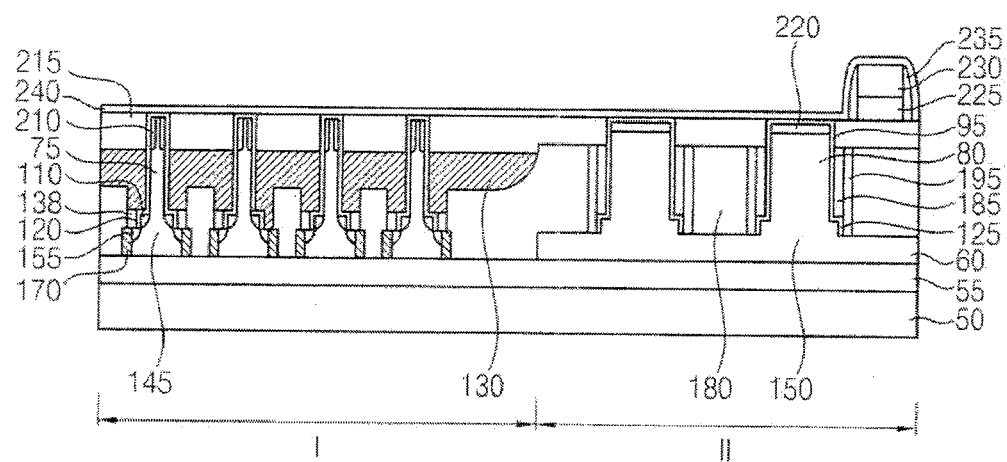

Referring to FIG. 14, an additional gate structure is then formed. The additional gate structure includes an additional gate electrode 225, an additional gate mask 230 and an additional gate spacer 235. A second protection layer 240 is formed on the second insulation layer 215 to cover the additional gate structure. The second protection layer 240 may include nitride or oxynitride.

Figure 15:
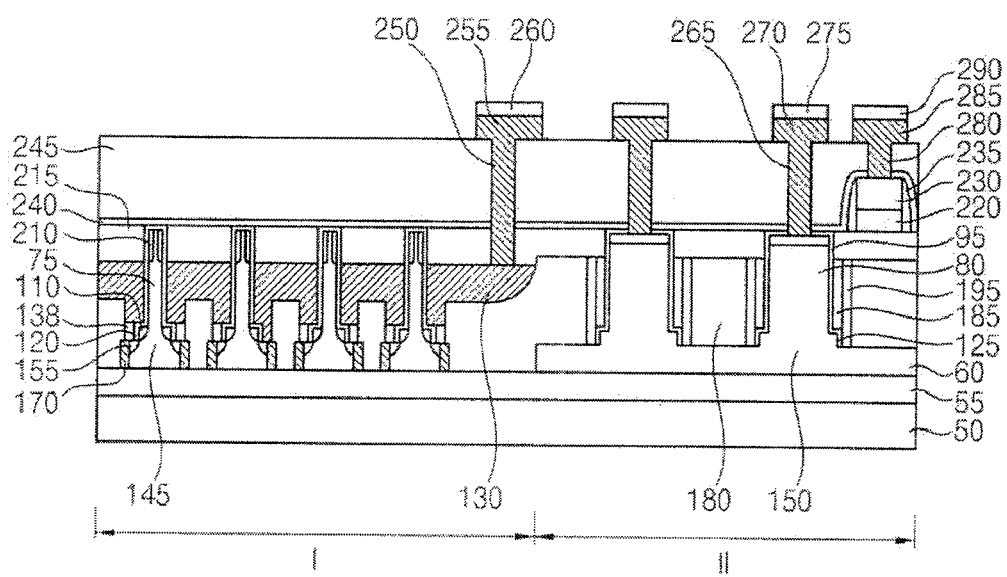

Referring to FIG. 15, a third insulation layer 245 is formed on the second protection layer 240, and then the third insulation layer 245 is partially etched to form plugs 250, 265 and 280. A plurality of conductive lines 255, 270 and 285 are formed on the plugs 250, 265 and 280, and masks 260, 275 and 290 are provided on the conductive lines 255, 270 and 285, respectively.

Figure 16:
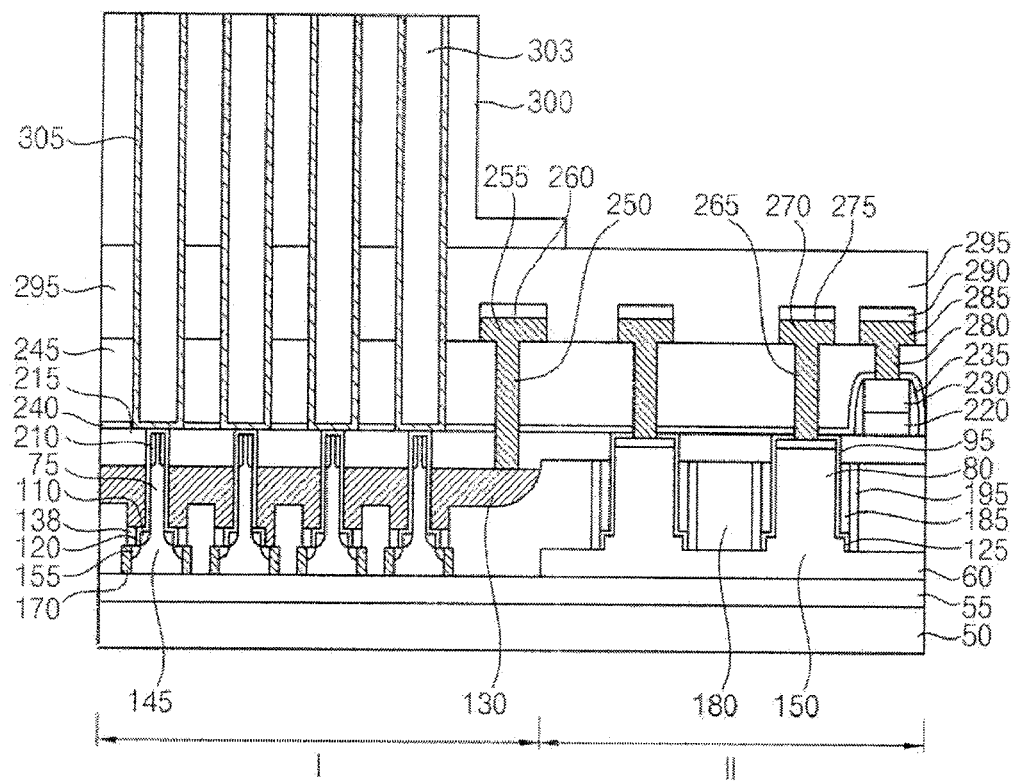

Referring to FIG. 16, a fourth insulation layer 295 and a mold layer 300 are stacked on the third insulation layer 245. Openings are formed through the mold layer 300, the fourth insulation layer 295, and third insulation layer 245 lined with a conductive pattern and filled with sacrificial layer patterns 303 to form lower electrodes 305 in the first area I.

Figure 17:
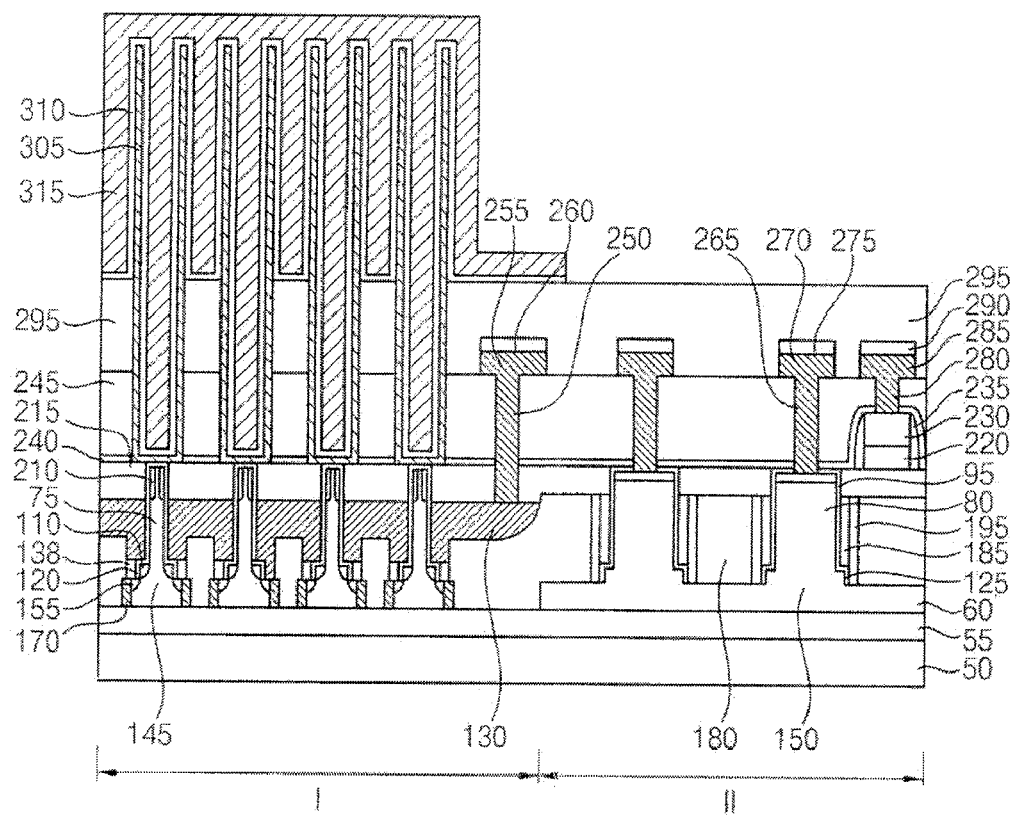

Referring to FIG. 17, the sacrificial layer patterns 303 are removed from the lower electrodes 305, and then dielectric layers 310 and upper electrodes 315 are formed above the lower electrodes 305. The upper electrodes 315 and the lower electrodes 305 thus form respective electrodes of storage capacitors connected to respective first transistors in the first area I.

Pursuant to the exemplary method described above, a memory device comprising a plurality of first transistors (VPTs) and second transistors (planar transistors) is formed.

The VPTs formed in the first area I may be used as memory cells, with respective storage capacitors connected thereto usable for storing data. The planar transistors formed in the second area II may be suitable for use in peripheral drive and amplifier circuits.

According to at least exemplary embodiments described above, the VPTs in the memory device include lower portions that are connected to the buried bit lines formed on an SOI substrate that extends in a first direction and upper portions that connect to word lines that extend in a second direction, the first direction being substantially perpendicular to the second direction. Due to the metal silicidation of the surface of the BBLs, the contact resistance of the BBLs is dramatically reduced. The metal silicide also provides low interface stress, and good adhesion to and minimal reaction with silicon oxide. The BBL offsets buffer the metal silicide and prevent leakage current flow therefrom.

According to an alternative method of forming a memory device with memory cells having VPTs, the processes described above with reference to FIG. 2 to FIG. 6 are performed on a substrate having a lower semiconductor layer 350, an insulation layer 355 and an upper semiconductor layer, and first upper portions (pillars) 370 and first lower portions 425 including second impurity regions 435, and intervening BBL offsets 400 and sidewall oxide layers 405 of VPTs have been formed in a first area III and portions of planar transistors comprising second lower portions 430 and second upper portions 375 have been formed in a second area IV. First and third spacers 490 and 415 are formed on sidewalls of the first upper portions 370 having first oxide layer patterns 380. Second and fourth spacers 395 and 420 are positioned on sidewalls of the second upper portions 375 having second oxide layer patterns 385. First and second masks 360 and 390 remain on the first and the second upper portions 370 and 375, respectively.

Figure 18:
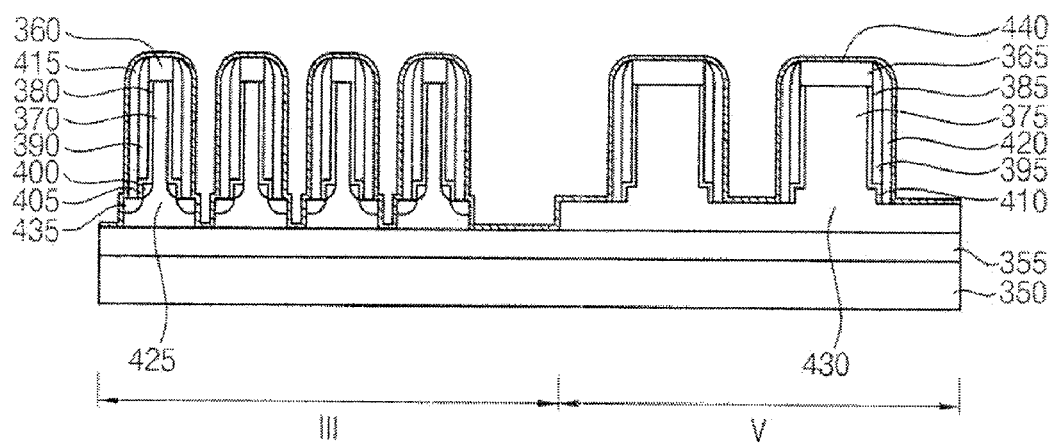

Referring now to FIG. 18, a metal layer 440 is formed on the resultant structures in the first and the second areas III and IV in preparation for silicidation. The metal layer 440 may include metal suitable for silicidation, such as any one or a combination of titanium, tungsten, cobalt, or nickel. According to exemplary embodiments, the metal layer 440 is formed without the prior formation of a protection layer in the second area IV.

Figure 19:
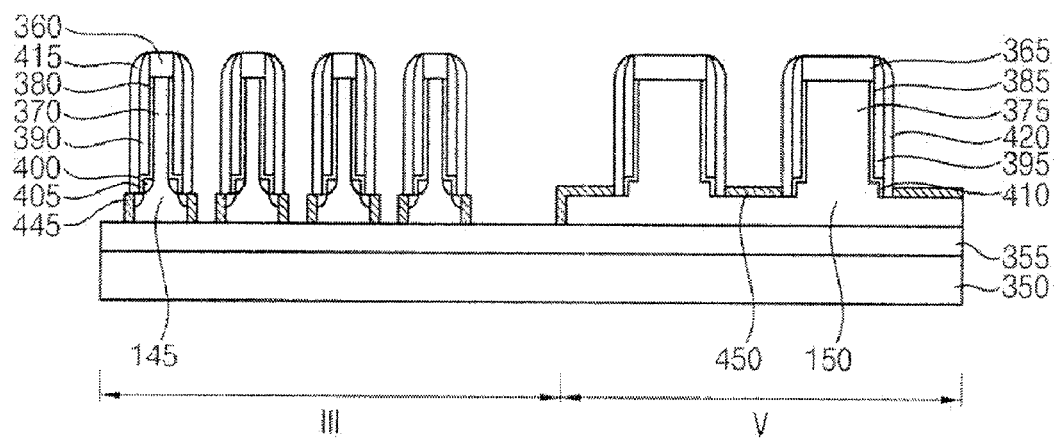

Referring to FIG. 19, a silicidation process is performed on the metal layer 440 to thereby form first metal silicide layers 445 in the first area I and second metal silicide layers 450 in the second area II. Note that in performing the silicidation process on the metal layer 440, metal silicide layers will form (react) on structure portions having silicon or doped polysilicon beneath the metal layer 440 and will not form (react) on structure portions having insulation materials such as nitride or oxide layers beneath the metal layer 440. The unreacted portions of metal are removed. According to exemplary embodiments, the lower body portions of the VPTs and the lower portions of planar transistors that include silicon or doped polysilicon beneath metal layer 440 will have formed thereon the metal silicide layers. A memory device thus formed according to exemplary embodiments will have metal silicide in the VPTs (e.g., encompassing the BBLs 425), and around the lower portions of the planar transistors in the second area II.

According to still another method of forming a memory device, the processes described above with reference to FIG. 2 to FIG. 6 are performed on a substrate having a lower semiconductor layer 480, an insulation layer 485 and an upper semiconductor layer, and first upper portions 500 and first lower portions (BBLs) 425 including second impurity regions 555, and intervening BBL offsets 530 and sidewall oxide layers 535 of VPT have been formed in a first area V and portions of planar transistors comprising second lower portions 430 and second upper portions 505 have been formed in a second area VI. First and third spacers 520 and 545 are formed on sidewalls of the first upper portions 500 having first oxide layer patterns 510. Second and fourth spacers 525 and 550 are positioned on sidewalls of the second upper portions 505 having second oxide layer patterns 515. First and second masks 490 and 495 remain respectively on the first and the second upper portions 500 and 505.

Figure 20:
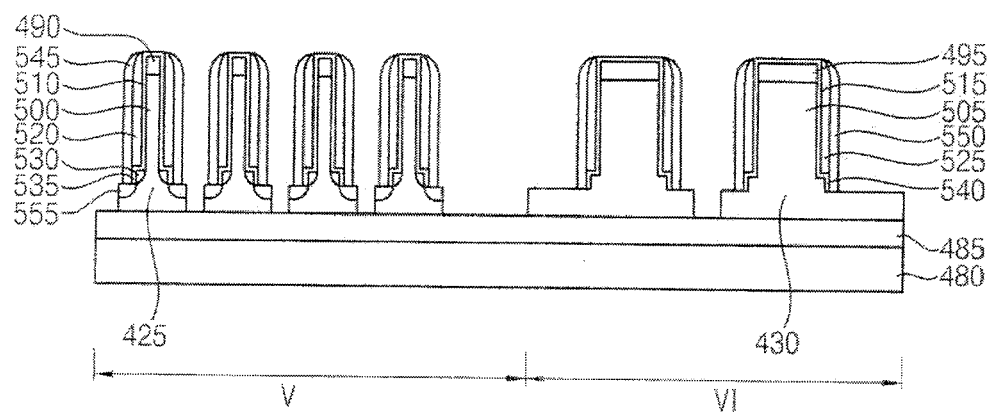
Figure 21:
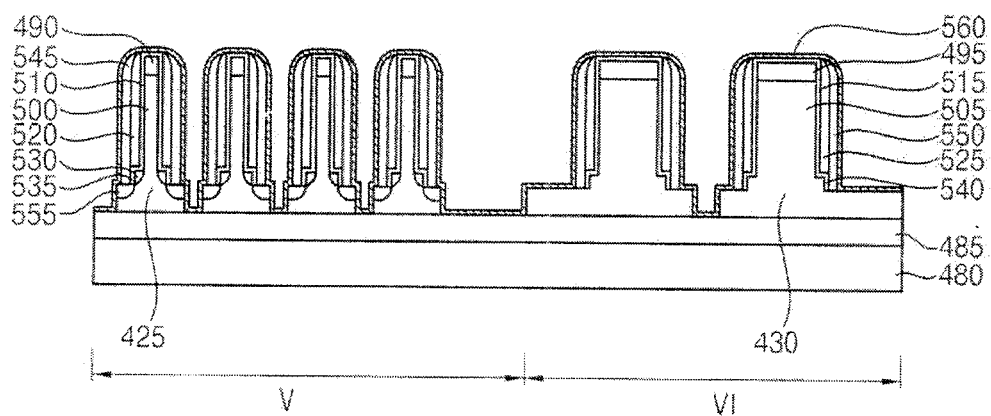
Figure 22:
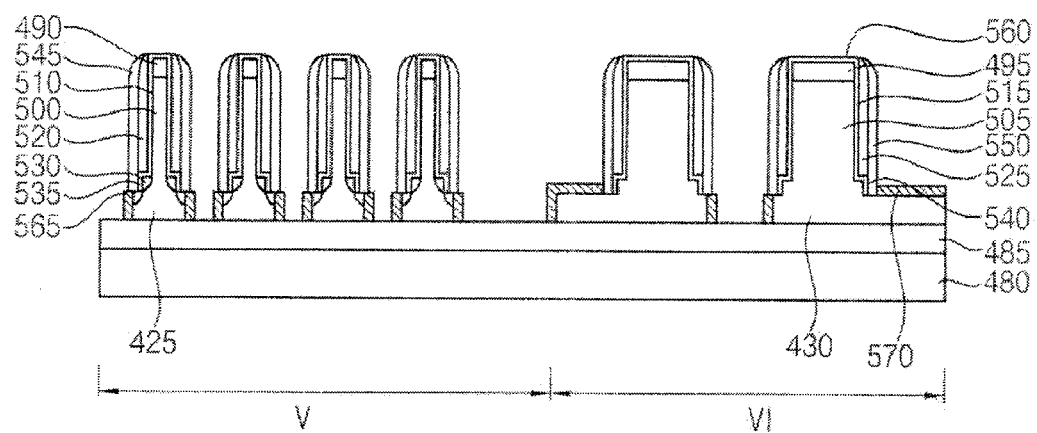

Referring to FIGS. 20 to 22, the planar transistors in the second area VI are separated from each other by fully etching the upper semiconductor layer until the insulation layer 485 is exposed. A metal layer 560 is formed on the resultant structures in the first and the second areas V and VI without the formation of a protection layer in the second area VI.

A silicidation process is performed on the metal layer 560 to thereby form first metal silicide layers 565 in the first area V and second metal silicide layers 570 in the second area VI. The memory device thus formed according to exemplary embodiments will have metal silicide in both the VPTs (e.g., encompassing the BBLs 425), and around the lower portions of the planar transistors in the second area VI, and a larger SOI substrate spacing exists between neighboring planar transistors in the second area VI.

Figure 23:
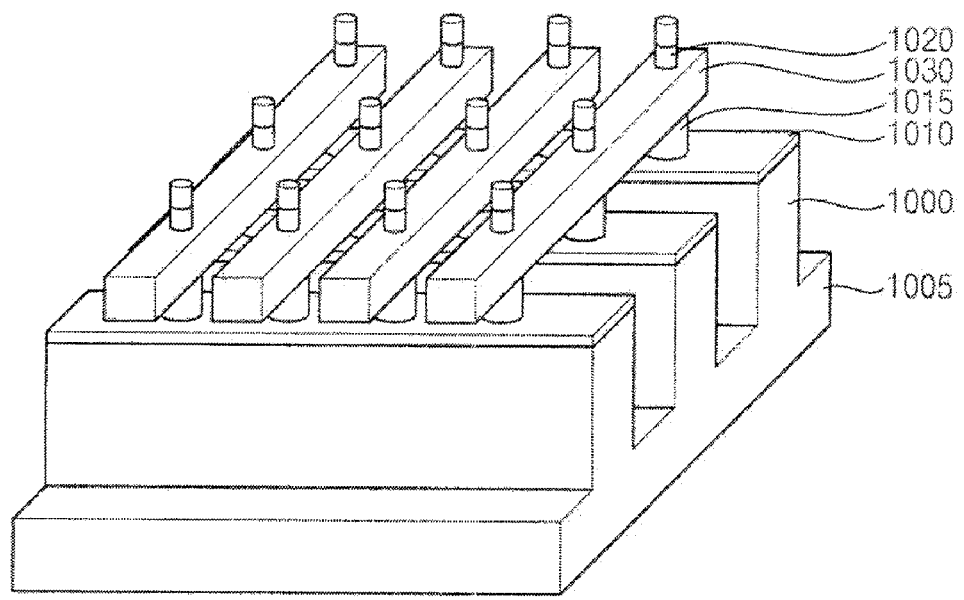
FIG. 23 illustrates a portion of a memory device having vertical pillar transistors according to alternative exemplary embodiments.

FIG. 23 illustrates a portion of a memory device having vertical pillar transistors according to alternative exemplary embodiments.

Referring to FIG. 23, the vertical pillar transistors are provided on an SOI substrate, which may comprise an insulation layer 1005 and a silicon layer. Each of the vertical pillar transistors includes a body that has a lower portion 1000 and an upper portion 1020. The lower and the upper portions 1000 and 1020 of the vertical pillar transistors may be formed by etching the silicon layer of the substrate. The lower portion 1020 of the vertical pillar transistors may be elongated and rectangular in shape. According to an exemplary embodiment, a buried bit line (BBL) 1010 may be formed by depositing a conductive layer on top surfaces of the lower portions 1000. The conductive layer may be formed by a silicidation process, using transition metal silicide. The metal silicide may produce characteristics such as high corrosion resistance, oxidation resistance, good adhesion to and minimal reaction with silicon oxide, low interface stress, etc. The metal silicide may be obtained by a silicidation process after a sputtering process, a CVD process, an atomic layer deposition ALD process, or other like processes.

The BBL 1010 may extend along a first (elongated) direction to support a plurality of vertical pillar transistors. Each upper portion 1020 of the vertical pillar transistor may be dimensioned and shaped like a pillar, and may be cylindrical in shape with an end portion formed over the lower portion 1000. A word line 1030 may extend in a second direction substantially perpendicular to the first direction to partially enclose a plurality of upper portions 1020 of a respective plurality of vertical pillar transistors. Each of the word lines 1030 may be spaced apart from the BBL 1010 by a BBL offset 1015. That is, each BBL 1010 may be separated from each word line 1030 by a distance corresponding to the BBL offset 1015.

According to exemplary embodiments, each BBL 1010 may include an impurity region and a metal silicide layer. The impurity region of the BBL 1010 may be disposed at a surface of the lower portion 1000 and the metal silicide layer may cover the impurity region. The metal silicide layer may cover the surface of the lower portion 1000 of the VPT. Alternatively, the metal silicide layer may further cover sidewalls of the lower portion 1000 of the vertical pillar transistors.

A method of fabricating a memory device including a memory cell region having a plurality of vertical pillar transistors is illustrated and described below with reference to FIGS. 24 to 33. FIGS. 24 to 33 illustrate an exemplary method of forming another memory device according to other embodiments.

Figure 24:
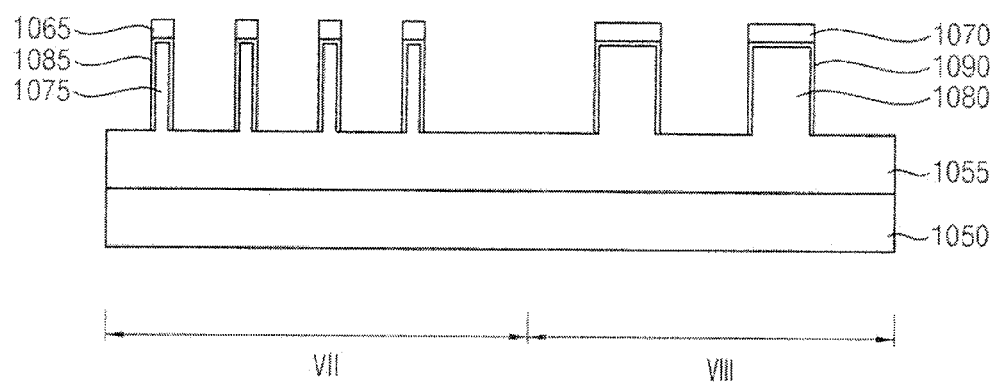
FIGS. 24 to 33 illustrate an exemplary method of forming another memory device according to other embodiments.

Referring to FIG. 24, first pad oxide layer patterns, second pad oxide layer patterns, a first mask 1065 and a second mask 1070 are provided on an upper semiconductor layer 1055 of a substrate. The substrate includes a lower semiconductor layer, an insulation layer 1050 and the upper semiconductor layer 1055. For example, the substrate may have an SOI structure or a GOI structure. The first pad oxide layer patterns and the first masks 1065 are positioned in a first area VII of the substrate. The second pad oxide layer patterns and the second masks 1070 are located in a second area VIII of the substrate. Each of the first and the second masks 1065 and 1070 may include a material having an etching selectivity relative to the upper semiconductor layer 1055 of the substrate.

The first and the second masks 1065 and 1070 are used as etching masks, and the upper semiconductor layer 1055 is partially etched to form first upper portions 1075 of first transistors (VPTs) in first area VII and second upper portions 1080 of second transistors (planar transistors) in the second area VIII. The first upper portions 1075 may be shaped in various geometric forms including rectangular, circular, elliptical, etc. For exemplary embodiments, the first upper portions 1075 may be shaped like pillars that extend vertically with a circular cross section, while the second transistors to be formed in second area VIII having the second upper portions 1080 may be shaped to have a wider aspect ratio and footprint on the upper semiconductor layer 1055. Each of the second upper portions 1080 may have a width substantially larger than that of each first upper portion 1075.

Upon forming the first and the second upper portions 1075 and 1080, first and second oxide layer patterns 1085 and 1090 are formed to cover the outer surfaces of the first upper portions 1075 and the second upper portions 1080 in the first and the second areas VII and VIII, respectively. The first and the second oxide layer patterns 1085 and 1090 may be formed by a thermal oxidation process, a radical oxidation process, etc. Etched damages to the first and the second upper portions 1075 and 1080 may be cured by forming the first and the second oxide layer patterns 1085 and 1090 thereon.

Figure 25:
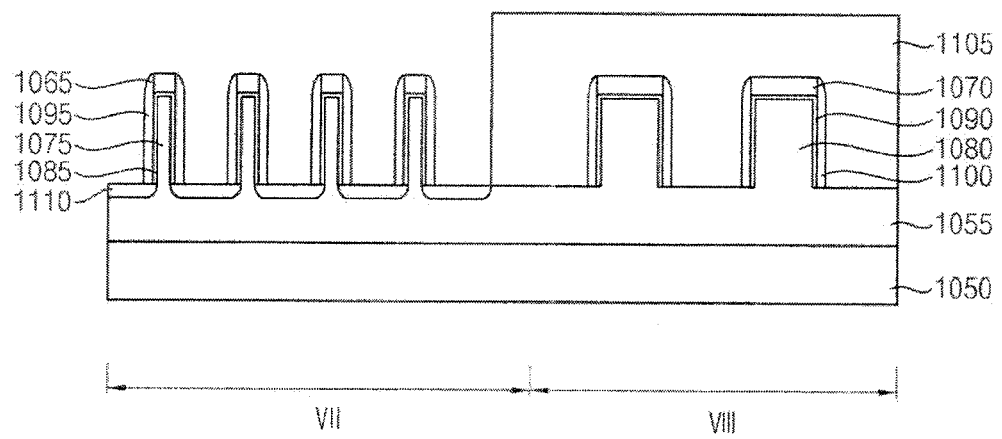

Referring to FIG. 25, a first nitride layer is formed on both of the first and the second areas VII and VIII to encompass the first and the second oxide layer patterns 1085 and 1090. The first nitride layer may be conformally formed along the profiles of the first and the second upper portions 1075 and 1080. The first nitride layer is etched to form first spacers 1095 in the first area VII and second spacers 1100 in the second area VIII. In the first and the second areas VII and VIII, except a lower portion proximal to the upper semiconductor layer 1055, the first spacers 1095 and second spacers 1100 may enclose substantially the entire sidewall of the first and the second upper portions 1075 and 1080.

In the first area VII, first impurities are implanted into portions of the upper semiconductor layer 1055 to form preliminary first impurity regions 1110 between adjacent first upper portions 1075. In the second area VIII, implantation mask 1105 is provided to cover the second upper portions 1080 and the upper semiconductor layer 1055 while forming the preliminary first impurity regions 1110.

The implantation mask 1105 is removed from the second area VIII. When the implantation mask 1105 includes an organic material such as photoresist, the implantation mask 1105 may be removed by an ashing process and/or a stripping process.

Figure 26:
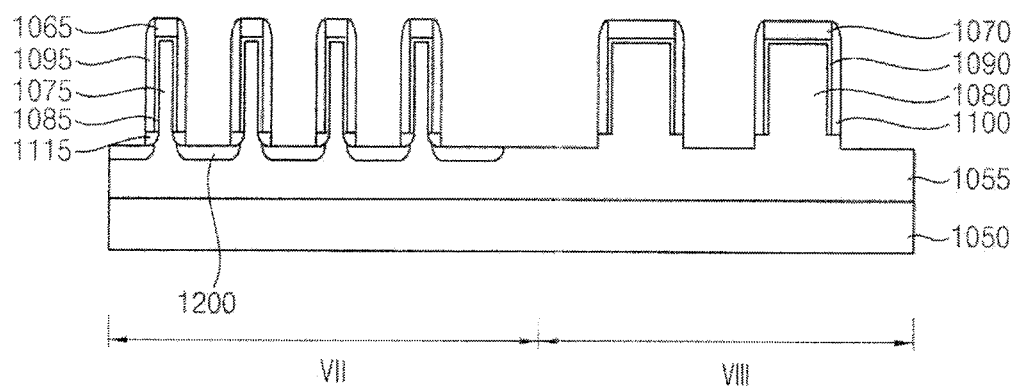

Referring to FIG. 26, using the first spacers 1095 as etching masks in the first area VII, portions of the upper semiconductor layer 1055 between the lower portions of the first spacers 1095 and the preliminary first impurity portions 1100 are partially etched to form first impurity regions 1115 of the first transistors. Additionally, portions of the upper semiconductor layer 1055 between adjacent lower portions of the second spacers 1100 are partially etched using the second spacers 1100 as etching masks in the second area VIII.

In the first area VII, second impurities are doped into portions of the upper semiconductor layer 1055 to form preliminary second impurity regions 1200 between adjacent first impurity regions 1115.

The first impurity portions 1115 may be referred to as first buried bit line (BBL) offsets. According to exemplary embodiments, the first BBL offset may correspond to the substantially same or substantially similar thickness (or height) of the first impurity region 1115. The first BBL offsets 1115 thus formed protrude substantially coaxially from the bottom portion of first upper portions 1075.

Figure 27:
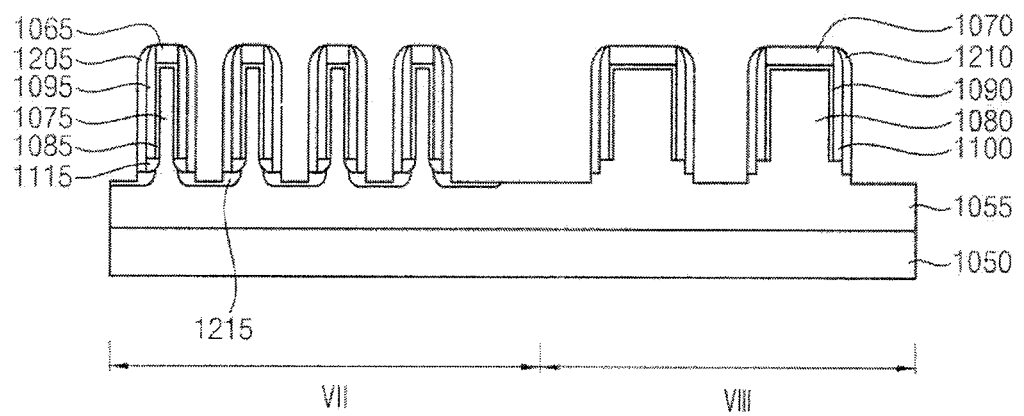

Referring now to FIG. 27, a second nitride layer is formed on the upper semiconductor layer 1055 to cover the resultant structures in the first and the second areas VII and VIII. For example, the second nitride layer may include silicon nitride. The second nitride layer is etched to form third spacers 1205 and fourth spacers 1210 on the first spacers 1095 and the second spacers 1100, respectively.

The third spacers 1205 cover the first impurity regions 1115, the first spacers 1095, and portions of the preliminary second impurity region 1200 in the first area VII. The fourth spacers 1210 cover the second spacers 1100 and portions of the upper semiconductor layer 1055 beneath the second spacers 1100 in the second area VIII. The third spacers 1205 and the fourth spacers 1210 are formed to block the formation of metal silicide on the above-described covered portions when metal silicidation is performed on the device, as will be further described below.

In the first area VII, portions of the upper semiconductor layer 1055 between adjacent third spacers 1205 are partially etched using the third spacers 1205 as etching masks to form second impurity regions 1215. Portions of the upper semiconductor layer 1055 are also partially etched using the fourth spacers 1210 as etching masks in the second area VIII.

In the first area VII, portions of the second impurity regions 1215 may be referred to as second BBL offsets. The second BBL offset may have a height (or thickness) substantially the same as or substantially smaller than the thickness (or height) of the second impurity region 1215. The second BBL offsets may also protrude substantially coaxially from the bottom portion of first upper portions 1075.

Figure 28:
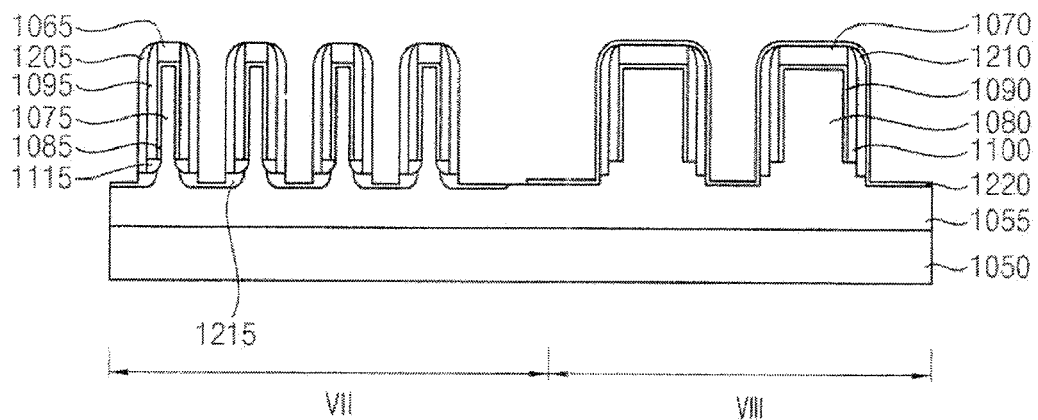

Referring to FIG. 28, an oxide protection layer pattern 1220 is formed to cover the resultant structures in the second area VIII. The oxide protection layer pattern 1220 prevents a metal layer from being formed on the resultant structures in the second area VIII. Alternatively, the oxide protection layer pattern 1220 may be omitted when the semiconductor device is manufactured by processes substantially the same as or substantially similar to those described with reference to FIGS. 18 and 19 or FIGS. 20 to 21.

Figure 29:
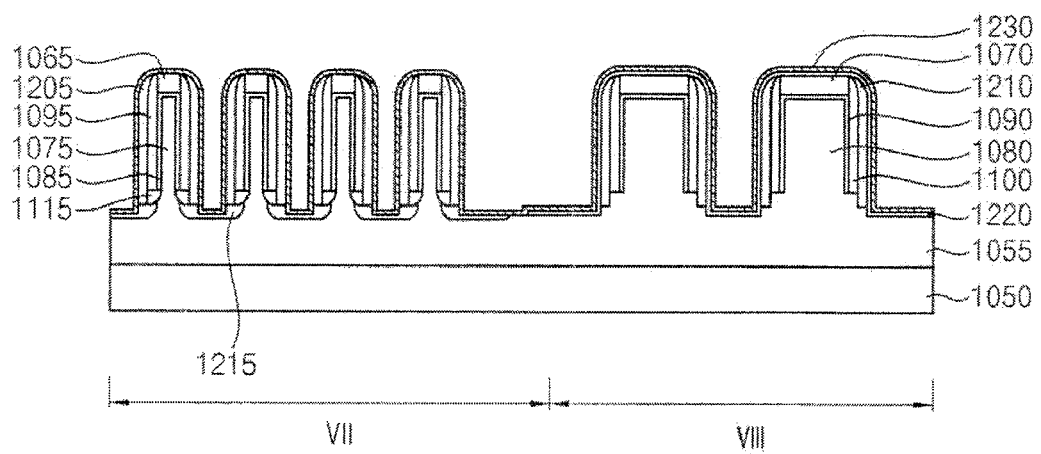

Referring to FIG. 29, a metal layer 1230 is formed to cover the structures in the first area VII including the second impurity regions 1215 and the third spacers 1205, and the resultant structures in the second area VIII. In the second area VIII, the metal layer 1230 is located on the oxide protection layer pattern 1220 to prevent the formation of metal silicide.

Figure 30:
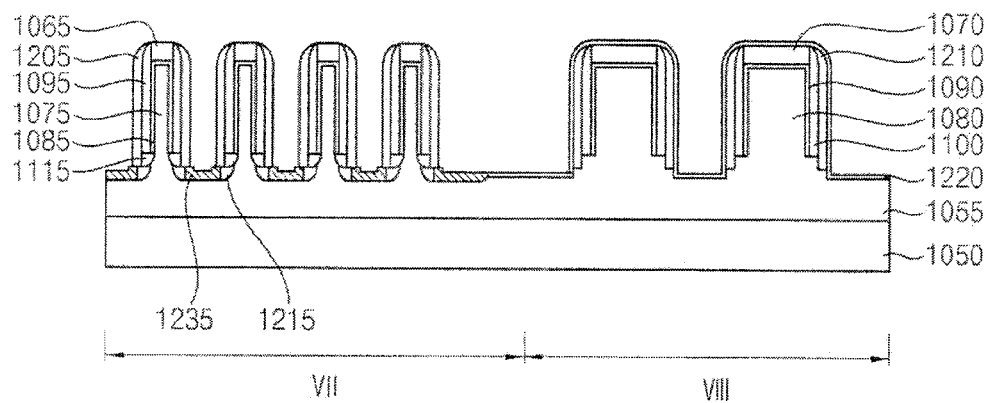

Referring to FIG. 30, a silicidation process is performed on the metal layer 1230 to thus form metal silicide layers 1235 on the second impurity regions 1215. According to exemplary embodiments, the silicidation process may be carried out using transition metal silicide, including near-noble and refractory metal silicide such as titanium silicide, tungsten silicide, cobalt silicide, nickel silicide, etc. The metal layer 1230 may be formed by a sputtering process, a CVD process, or other like processes. The metal layer 1230 may be heated, and the metal in the metal layer 1230 may react with the silicon or doped polysilicon layers underneath to form the metal silicide layers 1235 on the second impurity regions 1215. The un-reacted metal layer, e.g., the metal layer having insulation materials such as nitride or oxide underneath, is removed.

Figure 31:
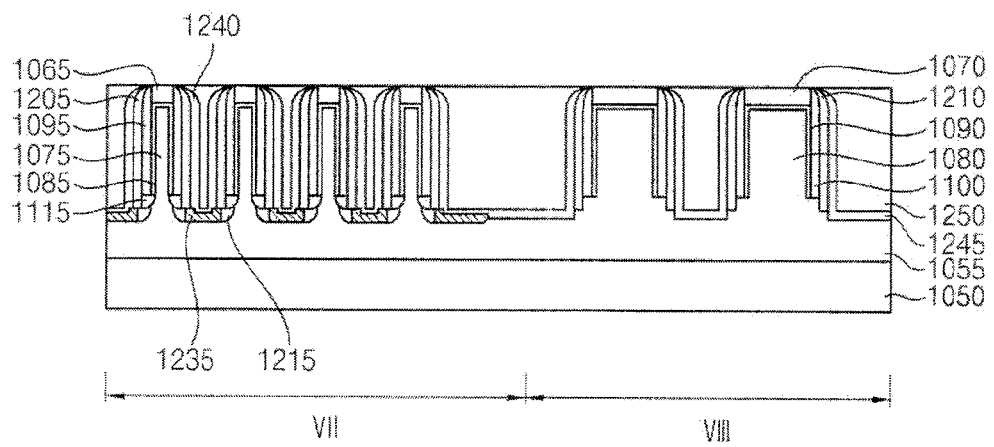

Referring to FIG. 31, after removing the oxide protection layer pattern 1220 in the second area VIII, a first liner layer 1240 and a second liner layer 1245 are formed on the resultant structures in the first and the second areas VII and VIII. For example, the first and the second liner layers 1240 and 1245 may include silicon nitride. The first liner layer 1240 covers the third spacers 1205 and the metal silicide layers 1235 in the first area VII. In the second area VIII, the second liner layer 1245 covers the fourth spacers 1210 and exposed portions of the upper semiconductor layer 1055 between adjacent fourth spacers 1210.

An insulation layer 1250 is formed on the resultant structure having the liner layer 1240 in the first and the second areas VII and VIII. The surface of the insulation layer 1250 is planarized, e.g., by a CMP process and/or etch back process, until the first and the second masks 12065 and 1070 are exposed.

Figure 32:
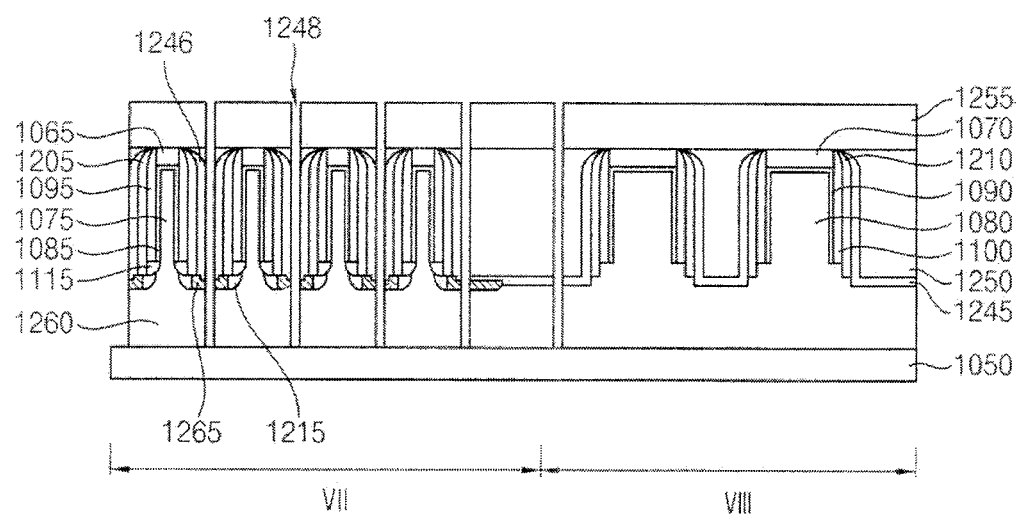

Referring to FIG. 32, a mask layer 1255, having slits 1248 or narrow trenches in the first area VII and without slits in the second area VIII, is then formed on the insulation layer 1250. The upper semiconductor layer 1055 and the liner layer 1240 are partially etched to form slits that extend toward the bottom of the substrate between adjacent first transistors. Hence, first lower portions 1260 and metal silicide layer patterns 1265 are formed in the first area VII. Further, fifth spacers 1246 are formed on the third spacers 1205. The fifth spacers 1246 cover the metal silicide layer patterns 1265 in the first area VII. The metal silicide layer patterns 1265 are located on surfaces of the first lower portions 1260 of the first transistors. According to exemplary embodiments, buried bit lines (BBLs) may include the second impurity regions 1215 and the metal silicide layer patters 1265. The BBLs are thus isolated from word lines due to the first and the second BBL offsets as described above.

Figure 33:
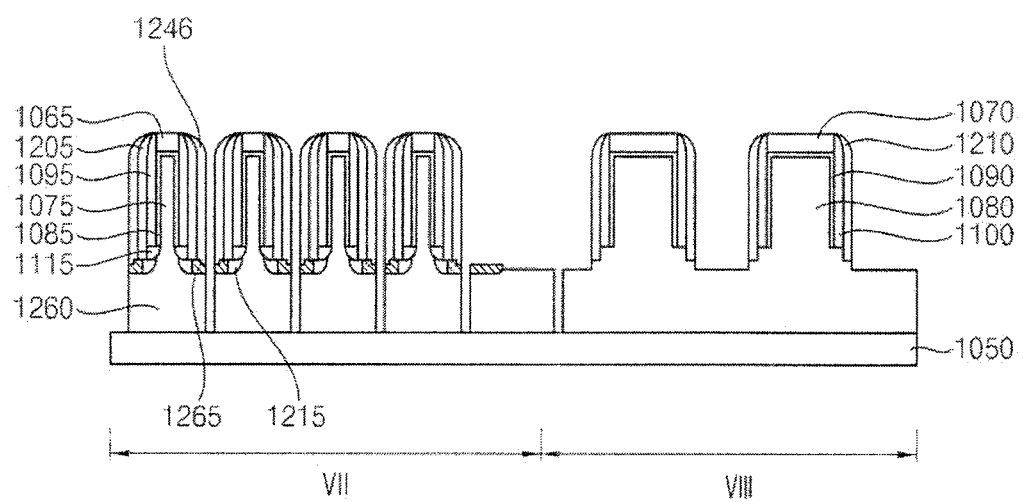

Referring to FIG. 33, the second liner layer 1245 is removed in the second area VIII, the semiconductor device having the first and the second transistors are formed on the substrate through processes substantially the same as or substantially similar to processes described in connection with FIGS. 11 to 17. According to exemplary embodiments, word lines may be separated from the BBLs including the metal silicide layers patterns 1265 by the first BBL offsets (first impurity regions 1115) and the second BBL offsets (the second impurity regions 1215). The first and the second BBL offset 1115 and 1215 together serve as an encroachment buffer to prevent leakage current flow from the metal silicide BBLs.

Figure 34:
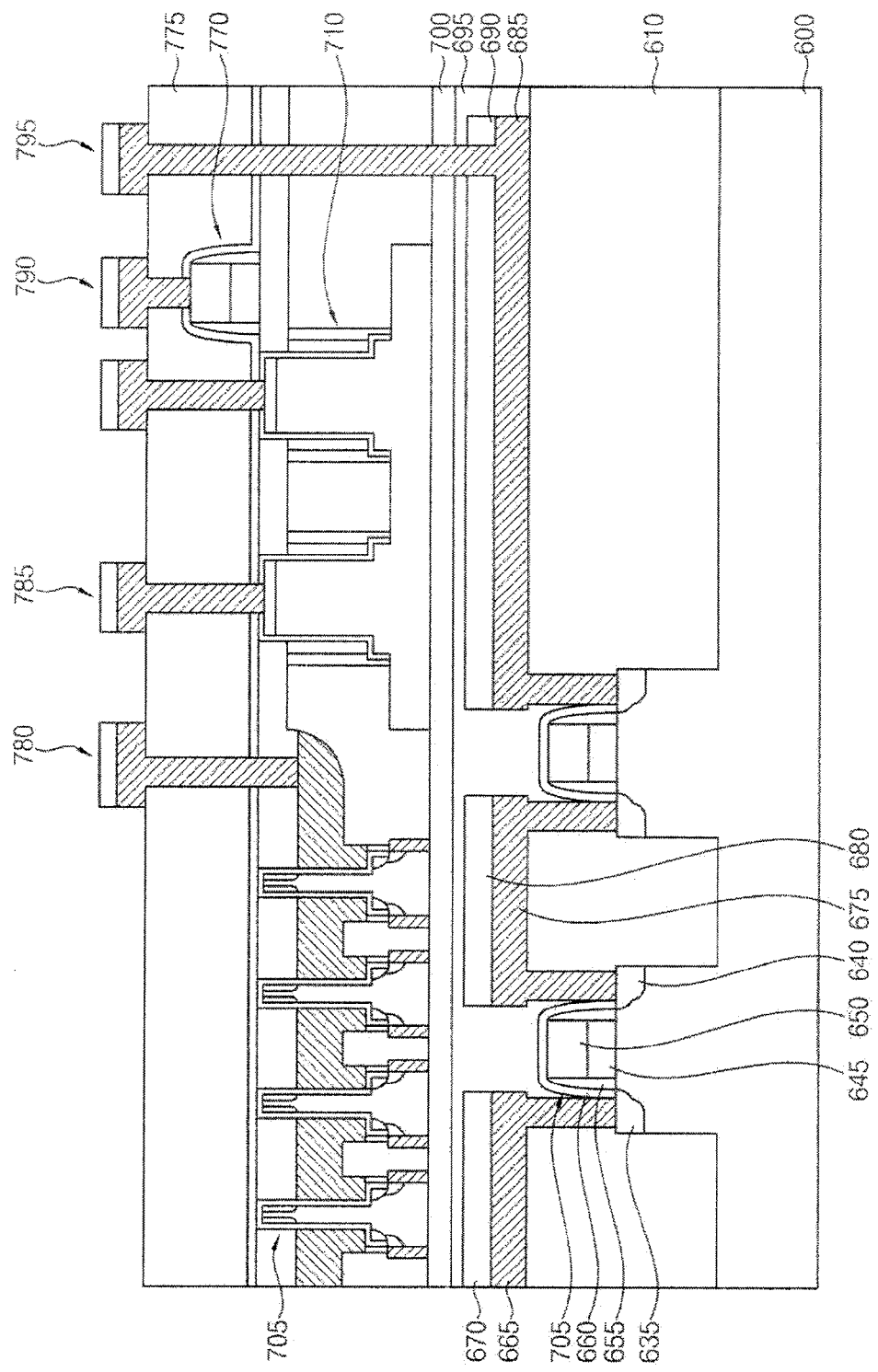
FIG. 34 and FIG. 35 illustrate multi-level memory devices according to exemplary embodiments.

FIG. 34 illustrates a multi-level memory device according to exemplary embodiments. Referring to FIG. 34, first planar transistors 705 are disposed on a first substrate 600 having isolation layer patterns 610, and VPTs 715 and second planar transistors 710 and 770 are disposed on a second substrate having an insulation layer 700. The VPTs 715 and the second planar transistors 710 and 770 may be formed through processes substantially the same as or substantially similar to the above-described processes for fabricating the VPTs and the planar transistors. A plurality of upper wirings 780, 785, 790 and 795 are formed through an upper insulating interlayer 775 to electrically connect a word line and the second planar transistors 710 and 770, respectively.

Each of the first planar transistors 705 includes source/drain regions 635 and 640, a gate electrode 645, a gate mask 650 and a gate spacer 655. The first planar transistors may be MOS transistors. A protection layer 660 is disposed to cover the gate mask 650 and the gate spacer 655. The protection layer 660 may protect each first transistor 705. Lower wirings 665, 675 and 685 are disposed on the isolation layer patterns 610. Each of the lower wirings 655, 675 and 685 make contact with the source/drain regions 635 and 640 of the first planar transistors 705.

Masks 670, 680 and 690 are formed on the lower wirings 665, 675 and 685, respectively. The masks 670, 680 and 690 prevent the lower wirings 665, 675 and 685 from being damaged while combining the first substrate 600 with the second substrate. A lower insulating interlayer 695 is formed on the first substrate 600 to cover the resultant structures including the first planar transistors 705. According to exemplary embodiments, the insulation layer 700 of the second substrate may be combined with the lower insulating interlayer 695 on the first substrate 600.

Figure 35:
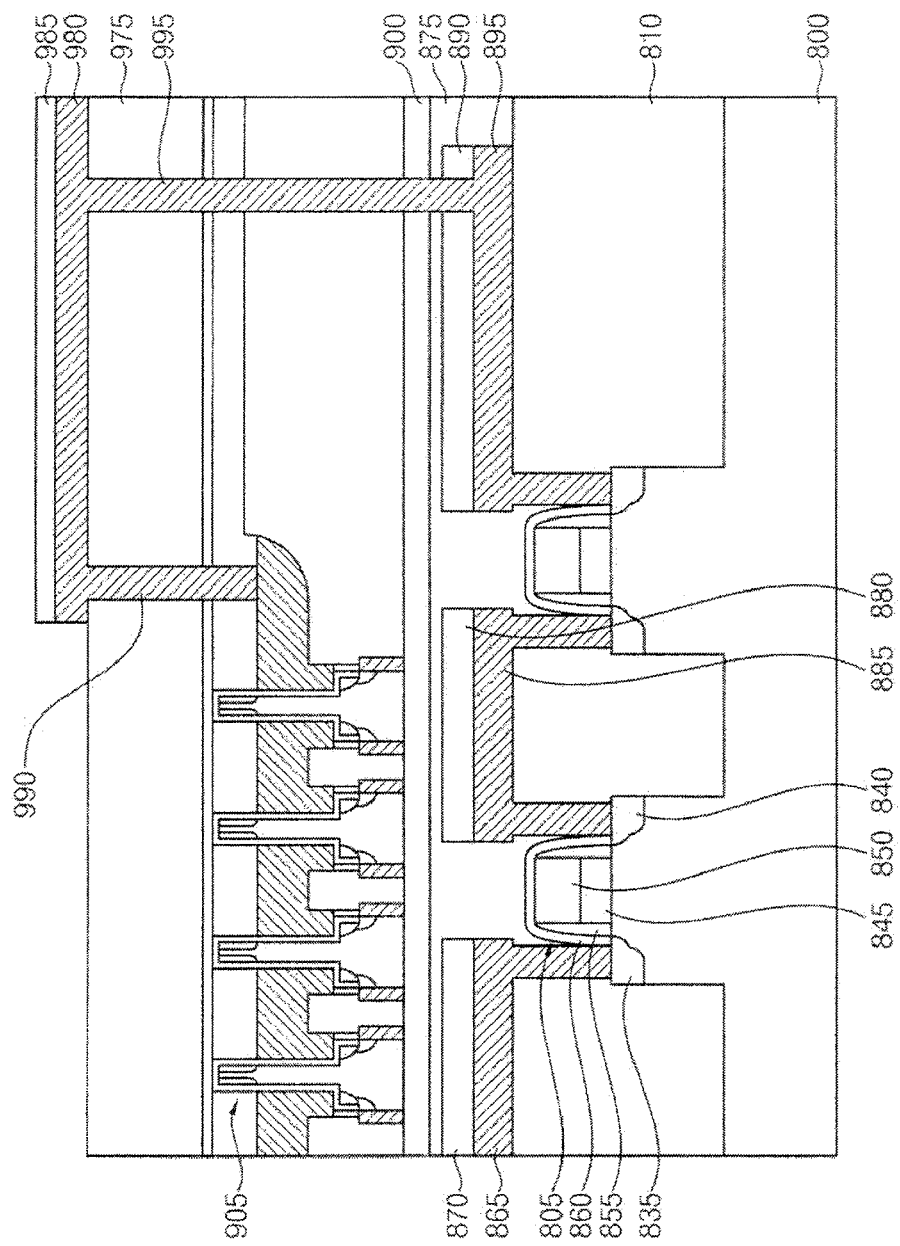

FIG. 35 illustrates another multi-level memory device according to an exemplary embodiment of the present inventive concept. As illustrated in FIG. 35, VPTs 905 are disposed on one level and planar transistors 805 are disposed on another level. The planar transistors 805 are provided on a first substrate 800 including isolation layer patterns 810 formed thereon. The VPTs 905 are formed on a second substrate including an insulation layer 900 and a semiconductor layer. Each planar transistor 805 includes source/drain regions 835 and 840, a gate electrode 845, a gate mask 850 and a gate spacer 855. A protection layer 860 for protecting the planar transistor 805 is formed to cover the gate mask 850 and the gate spacer 855. Lower wirings 865, 885 and 895 are disposed on the isolation layer patterns 810. Each of the lower wirings 865, 885 and 895 are electrically connected to the source/drain regions 835 and 840 of the planar transistors 805. Masks 870, 880 and 890 are provided on the lower wirings 865, 885 and 890 to prevent the lower wirings 865, 885 and 895 from being damaged while combining the first substrate 800 with the second substrate. A lower insulating interlayer 875 is formed over the first substrate 800 to cover the resultant structures having the planar transistors 805. The insulation layer 900 of the second substrate may be combined with the lower insulating interlayer 875 formed on the first substrate 800.

An upper insulating interlayer 975 is formed over the second substrate, and an upper wiring 980 is formed through the upper insulating interlayer 975. The upper wiring 980 is electrically connected to a word line of the VPT 905 and the planar transistor 805. According to exemplary embodiments, a first plug 990 may electrically connect the upper wiring 980 to the word line, and a second plug 995 may electrically connect the upper wiring 995 to one of the lower wirings 865, 885 and 895. A mask 985 is provided on the upper wiring 980.

Figure 36:
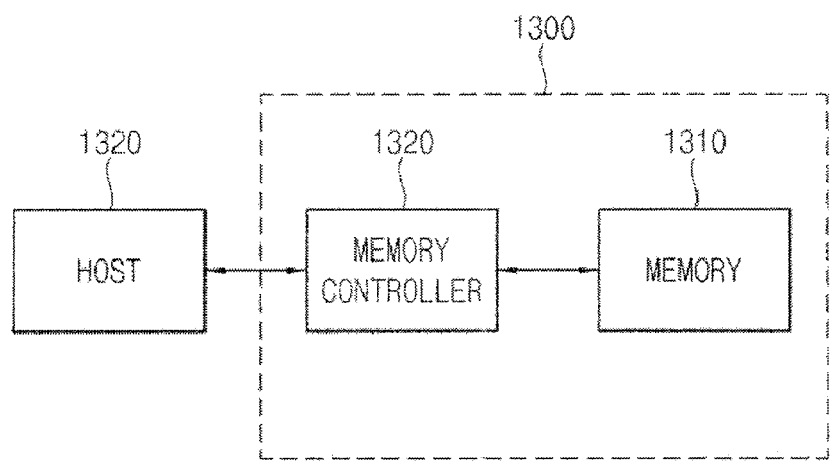
FIG. 36 illustrates a memory system including a semiconductor device according to at least one embodiment.

Referring to FIG. 36, a memory system including a semiconductor device according to at least one embodiment will be described. A memory system 1300 includes a memory controller 1320 and a memory device 1310 having a varying data storage capacitor structure according to at least one embodiment. The memory controller 1320 controls the memory device 1310 to read or write data from/into the memory device 1310 in response to a read/write request of a host 1330. The memory controller 1320 may include an address mapping table for mapping an address provided from the host 1330 (e.g., mobile devices or computer systems) into a physical address of the memory device 1310.

Figure 37:
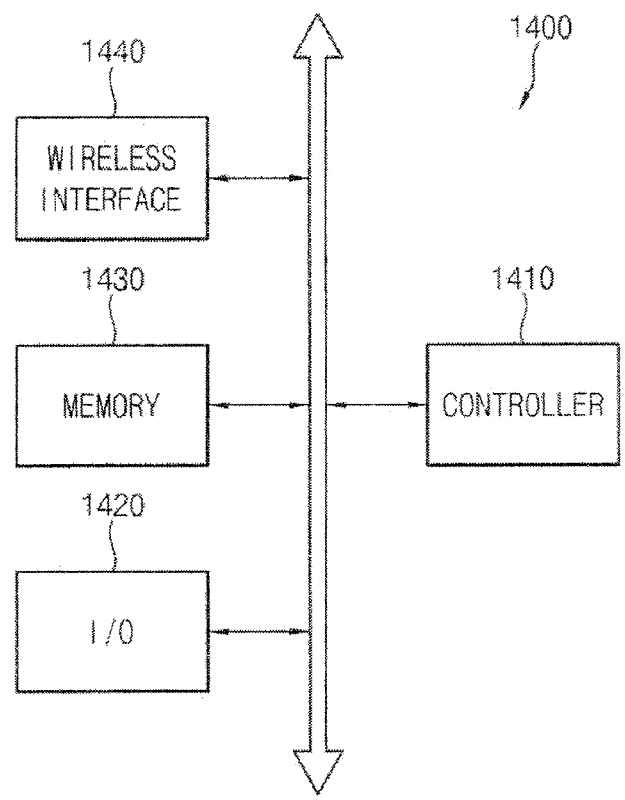
FIG. 37 illustrates an electron device including a semiconductor device according to exemplary embodiments.

Referring to FIG. 37, an electron device including a semiconductor device according to exemplary embodiments will be described. The electron device 1400 may be used in a wireless communication device (e.g., a personal computer (PC), a personal digital assistant (PDA), an MP3 player, a digital audio recorder, a pen-shaped computer, a digital camera, a video recorder, etc.) or in any device capable of transmitting and/or receiving information via wireless environments.

The electron device 1400 includes a controller 1410, an input/output (I/O) device 1420 (e.g., a keypad, a keyboard, and a display), a memory device 1430 having a varying data storage capacitor structure according to at least one embodiment, and a wireless interface 1440. The controller 1410 may include at least one of a microprocessor, a digital signal processor, or a similar processing device. The memory device 1430 may be used to store commands executed by the controller 1410, for example. The memory 1430 may be used to store user data. The memory device 1430 includes a semiconductor device according to at least one embodiment. The electron device 1400 may utilize the wireless interface 1440 to transmit/receive data via a wireless communication network. For example, the wireless interface 1440 may include an antenna and/or a wireless transceiver. The electron device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Figure 38:
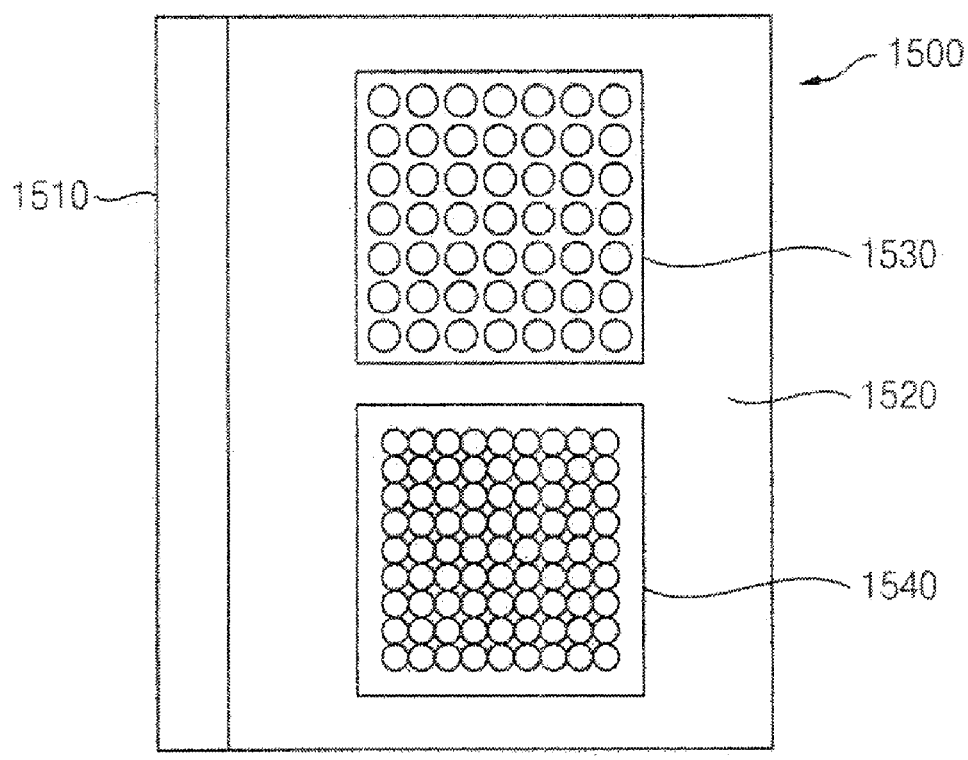
FIG. 38 illustrates a modular memory device including a semiconductor device according to exemplary embodiments.

Referring to FIG. 38, a modular memory device including a semiconductor device according to exemplary embodiments will be described. The modular memory device 1500 may include a printed circuit board 1520. The printed circuit board 1520 may form one of the external surfaces of the modular memory device 1500. The printed circuit board 1520 may support a memory unit 1530, a device interface unit 1540, and an electrical connector 1510.

The memory unit 1530 having a varying data storage capacitor structure according to at least one embodiment of the present invention may include a three-dimensional memory array and may be connected to a memory array controller. The memory array may include the appropriate number of memory cells arranged in a three-dimensional lattice on the printed circuit board 1520. The device interface unit 1540 may be formed on a separated substrate such that the device interface unit 1540 may be electrically connected to the memory unit 1530 and the electrical connector 1510 through the printed circuit board 1520. Additionally, the memory unit 1530 and the device interface unit 1540 may be directly mounted on the printed circuit board 1520. The device interface unit 1540 may include components necessary for generating voltages, clock frequencies, and protocol logic.

The foregoing is illustrative of exemplary embodiments, and is not to be construed as limiting thereof. Although a few exemplary embodiments have been described, those skilled in the art will readily appreciate that many modifications are possible in the exemplary embodiments without materially departing from the novel teachings. Accordingly, all such modifications are intended to be included within the scope of exemplary embodiments as defined in the claims. Therefore, it is to be understood that the exemplary embodiments of the inventive concept are defined by the following claims, with equivalents of the claims to be included therein.

What is claimed is:

1. A semiconductor device, comprising:
a vertical pillar transistor (VPT) formed on a substrate, the VPT including a body that has a lower portion and an upper portion, a source/drain node disposed at the upper portion of the body, and a drain/source node disposed at the lower portion of the body;
a buried bit line (BBL) formed on at least an upper surface of the lower portion, the BBL including metal silicide;
a word line partially enclosing the upper portion of the body of the VPT; and
a lightly doped offset region disposed immediately between the world line and BBL,
wherein the BBL extends along a first direction and the word line extends in a second direction substantially perpendicular to the first direction.

2. The semiconductor device of claim 1, wherein the BBL is further formed on a sidewall of the lower portion.

3. The semiconductor of claim 1, wherein the offset region is disposed immediately above the drain/source node at the lower portion of the VPT.

4. The semiconductor of claim 1 wherein the offset region protrudes from a lower end portion of the upper portion of the body of the VPT.

5. The semiconductor of claim 1, further including an insulating pattern interposed between the word line and the BBL.

6. The semiconductor of claim 1, wherein the upper portion of the body is coated with an insulator.

7. The semiconductor of claim 1, further including a capacitor connecting to the upper end portion of the body of the VPT, wherein the capacitor comprises two conductive plates that extend vertically from the VPT.

8. The semiconductor of claim 1, wherein the BBL is electrically connected to a plurality of VPTs disposed along the first direction.

9. The semiconductor of claim 1, further including at least one planar transistor having both a source node and a drain node disposed on the substrate.

10. The semiconductor of claim 8, further including at least one planar transistor having both a source node and a drain node disposed on another substrate disposed a level above or a level below the VPT and the substrate.

11. The semiconductor of claim 1, further including at least one planar transistor having both a source node and a drain node disposed on another substrate disposed a level above or a level below the VPT and the substrate.

12. The semiconductor of claim 1, wherein the metal silicide is one of titanium, tungsten, cobalt, nickel, or any combination thereof.

13. The semiconductor of claim 1, wherein the device is a DRAM.

14. A semiconductor device, comprising:
a vertical pillar transistor (VPT) formed on a substrate, the VPT including a body that has a substantially rectangular lower portion supporting a substantially cylindrical upper portion, a source/drain node disposed at an upper end portion of the body and a drain/source node disposed at the lower portion of the body;

a protrusion that protrudes substantially coaxially from the bottom portion of the upper portion of the body;

a buried bit line (BBL) formed continuously on the upper surface of the lower portion of the body and a portion of the protrusion, the BBL including metal silicide;

a word line that partially encloses the upper portion of the body; and a lightly doped offset region disposed immediately between the word line and the BBL, wherein the BBL extends along a first direction and the word line extends in a second direction substantially perpendicular to the first direction.

15. The semiconductor of claim 14, wherein a bottom portion of the word line contacts the upper portion of the protrusion.

16. The semiconductor of claim 14, wherein the upper portion of the protrusion is an insulator.

17. The semiconductor of claim 14, further including a capacitor connecting to the upper end portion of the body of the VPT, wherein the capacitor comprises two conductive plates that extend vertically from the VPT.

18. The semiconductor of claim 14, wherein the BBL is electrically connected to a plurality of VPTs disposed along the first direction.

19. The semiconductor of claim 14, further including at least one planar transistor having both a source node and a drain node disposed on the substrate.

20. The semiconductor of claim 19, further including at least one planar transistor having both a source node and a drain node disposed on another substrate disposed a level above or a level below the VPT.

21. The semiconductor of claim 14, further including at least one planar transistor having both a source node and a drain node disposed on another substrate disposed a level above or a level below the VPT.

22. A memory system, comprising:

an interface part that interfaces with an external device;

a controller that communicates with the interface part and a memory device via address and data buses, wherein the memory device comprises:

a vertical pillar transistor (VPT) formed on a substrate, the VPT including a body that has a lower portion and an upper portion, a source/drain node disposed at an upper end portion of the upper portion of the body, and a drain/source node disposed at the lower portion of the body;

a buried bit line (BBL) formed continuously on a sidewall and a surface of the lower portion, the BBL including metal silicide;

a word line that partially encloses the upper portion of the body of the VPT; and a lightly doped offset region disposed immediately between the word line and the BBL, wherein the BBL extends along a first direction and the word line extends in a second direction substantially perpendicular to the first direction.

23. A computer system comprising the memory device of claim 1, wherein the computer system is one of the group consisting of a personal computer (PC), a personal digital assistant (PDA), an MP3 player, a digital audio recorder, a pen-shaped computer, a digital camera, and a video recorder.

* * * * *